(12) United States Patent
Eriksson et al.

(10) Patent No.: US 9,842,921 B2
(45) Date of Patent: Dec. 12, 2017

(54) DIRECT TUNNEL BARRIER CONTROL GATES IN A TWO-DIMENSIONAL ELECTRONIC SYSTEM

(71) Applicant: Wisconsin Alumni Research Foundation, Madison, WI (US)

(72) Inventors: Mark A. Eriksson, Madison, WI (US); John King Gamble, Madison, WI (US); Daniel R. Ward, Madison, WI (US); Susan Nan Coppersmith, Madison, WI (US); Mark G. Friesen, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 61 days.

(21) Appl. No.: 14/205,811

(22) Filed: Mar. 12, 2014

(65) Prior Publication Data
US 2015/0279981 A1    Oct. 1, 2015

Related U.S. Application Data

(60) Provisional application No. 61/782,332, filed on Mar. 14, 2013.

(51) Int. Cl.
*B82Y 10/00* (2011.01)
*H01L 29/778* (2006.01)
(Continued)

(52) U.S. Cl.
CPC ........ *H01L 29/7782* (2013.01); *H01L 27/088* (2013.01); *H01L 29/127* (2013.01);
(Continued)

(58) Field of Classification Search
CPC ... H01L 29/10; H01L 29/1033; H01L 29/152; H01L 29/155; H01L 29/161;
(Continued)

(56) References Cited

U.S. PATENT DOCUMENTS 5,274,246 A * 12/1993 Hopkins ................ B82Y 20/00
257/17
5,670,790 A * 9/1997 Katoh ................ H01L 29/7883
257/14
(Continued)

OTHER PUBLICATIONS

Kouwenhoven et al., "Electron Transport in Quantum dots", Proceedings of the Advanced Study on Mesoscoic Electron Transport (1997).*

(Continued)

*Primary Examiner* — Jay C Kim
(74) *Attorney, Agent, or Firm* — Bell & Manning, LLC

(57) ABSTRACT

A quantum semiconductor device is provided. The quantum semiconductor device includes a quantum heterostructure, a dielectric layer, and an electrode. The quantum heterostructure includes a quantum well layer that includes a first 2DEG region, a second 2DEG region, and a third 2DEG region. A first tunnel barrier exists between the first 2DEG region and the second 2DEG region. A second tunnel barrier exists between the second 2DEG region and the third 2DEG region. A third tunnel barrier exists either between the first 2DEG region and the third 2DEG region. The dielectric layer is formed on the quantum heterostructure. The electrode is formed on the dielectric layer directly above the first tunnel barrier.

21 Claims, 26 Drawing Sheets

(51) Int. Cl.
*H01L 29/423* (2006.01)
*H01L 29/76* (2006.01)
*H01L 29/41* (2006.01)
*H01L 29/12* (2006.01)
*H01L 27/088* (2006.01)
*H01L 29/165* (2006.01)
*H01L 29/16* (2006.01)

(52) U.S. Cl.
CPC ............ *H01L 29/41* (2013.01); *H01L 29/413* (2013.01); *H01L 29/423* (2013.01); *H01L 29/4238* (2013.01); *H01L 29/7613* (2013.01); *H01L 29/165* (2013.01); *H01L 29/1606* (2013.01); *H01L 29/778* (2013.01)

(58) Field of Classification Search
CPC . H01L 29/165; H01L 29/267; H01L 29/7782; B82Y 10/00
USPC .......................................................... 257/14
See application file for complete search history.

(56) References Cited

U.S. PATENT DOCUMENTS

| | | | | |
|---|---|---|---|---|
| 5,677,637 | A * | 10/1997 | Nakazato | B82Y 10/00 326/136 |
| 5,889,288 | A * | 3/1999 | Futatsugi | B82Y 10/00 257/17 |
| 5,937,295 | A * | 8/1999 | Chen | B82Y 10/00 257/E21.209 |
| 6,333,516 | B1 * | 12/2001 | Katoh | B82Y 10/00 257/15 |
| 6,515,339 | B2 * | 2/2003 | Shin | B82Y 10/00 257/24 |
| 6,597,010 | B2 * | 7/2003 | Eriksson | B82Y 10/00 257/12 |
| 6,635,898 | B2 * | 10/2003 | Williams | G06N 99/002 257/14 |
| 7,026,641 | B2 * | 4/2006 | Mohseni | B82Y 10/00 257/14 |
| 7,135,697 | B2 * | 11/2006 | Friesen | B82Y 10/00 257/14 |
| 7,364,923 | B2 * | 4/2008 | Lidar | B82Y 10/00 257/31 |
| 7,659,538 | B2 * | 2/2010 | Snyder | B82Y 10/00 257/14 |
| 7,830,695 | B1 * | 11/2010 | Moon | G01R 33/1284 257/14 |
| 8,043,978 | B2 * | 10/2011 | Miyazaki | B82Y 10/00 148/285 |
| 8,164,082 | B2 * | 4/2012 | Friesen | B82Y 10/00 257/9 |
| 8,507,894 | B2 * | 8/2013 | Morello | B82Y 10/00 257/14 |
| 9,153,594 | B2 * | 10/2015 | Jain | G11C 11/56 |

OTHER PUBLICATIONS

Elzerman et al., "Semiconductor Few-Electron Quantum Dots as Spin Qubits", Lecture Notes Physics 667 (2005) pp. 25-95.*
Avinun-Kalish et al., "Crossover from 'mesoscopic' to 'universal' phase for electron transmission in quantum dots", Nature (2005) pp. 529-533.*
Prada et al., "Electron-nuclear spin transfer in quantum-dot networks", Nanotechnology 16 (2005) pp. S266-S272.*
Lai et al., "Pauli Spin Blockade in a Highly Tunable Silicon Double Quantum Dot", Scientific Reports (2011) pp. 1-6.*
Klinke et al., "Field-Effect Transistors Assembled from Functionalized Carbon Nanotubes", Nano Letters 6 (2006) pp. 906-910.*
Koh et al., Pulse-gated quantum dot hybrid qubit, Phys. Rev. Lett., vol. 109, No. 250503, v1, Jul. 24, 2012, pp. 1-6.
Koh et al., Pulse-Gated Quantum-Dot Hybrid Qubit, Phys. Rev. Lett., vol. 109, No. 250503, Dec. 20, 2012, pp. 1-5.
Shi et al., Coherent Quantum Oscillations in a Silicon Charge Qubit, Phys. Rev. B 88, No. 075416, Aug. 2, 2012, pp. 1-7.
Hu et al., A Ge/Si heterostructure nanowire-based double quantum dot with integrated charge sensor, Nature Nanotechnology, vol. 2, Sep. 30, 2007, pp. 622-625.
Eriksson et al., Nanowires charge towards integration, Nature Nanotechnology, vol. 2, Oct. 2007, pp. 595-596.
Frey et al., Dipole Coupling of a Double Quantum Dot to a Microwave Resonator, Physical Review Letters, PRL 108, 046807, Jan. 25, 2012, pp. 1-5.
Shulman et al., Demonstration of Entanglement of Electrostatically Coupled Singlet-Triplet Qubits, Science, vol. 336, Apr. 13, 2012, pp. 202-205.
Petersson et al., Circuit quantum electrodynamics with a spin qubit, Nature, vol. 490, Oct. 18, 2012, pp. 380-383.
Lu et al., Single-electron transistor strongly coupled to an electrostatically defined quantum dot, Applied Physics Letters, vol. 77, No. 17, Oct. 23, 2000, pp. 2746-2748.

* cited by examiner

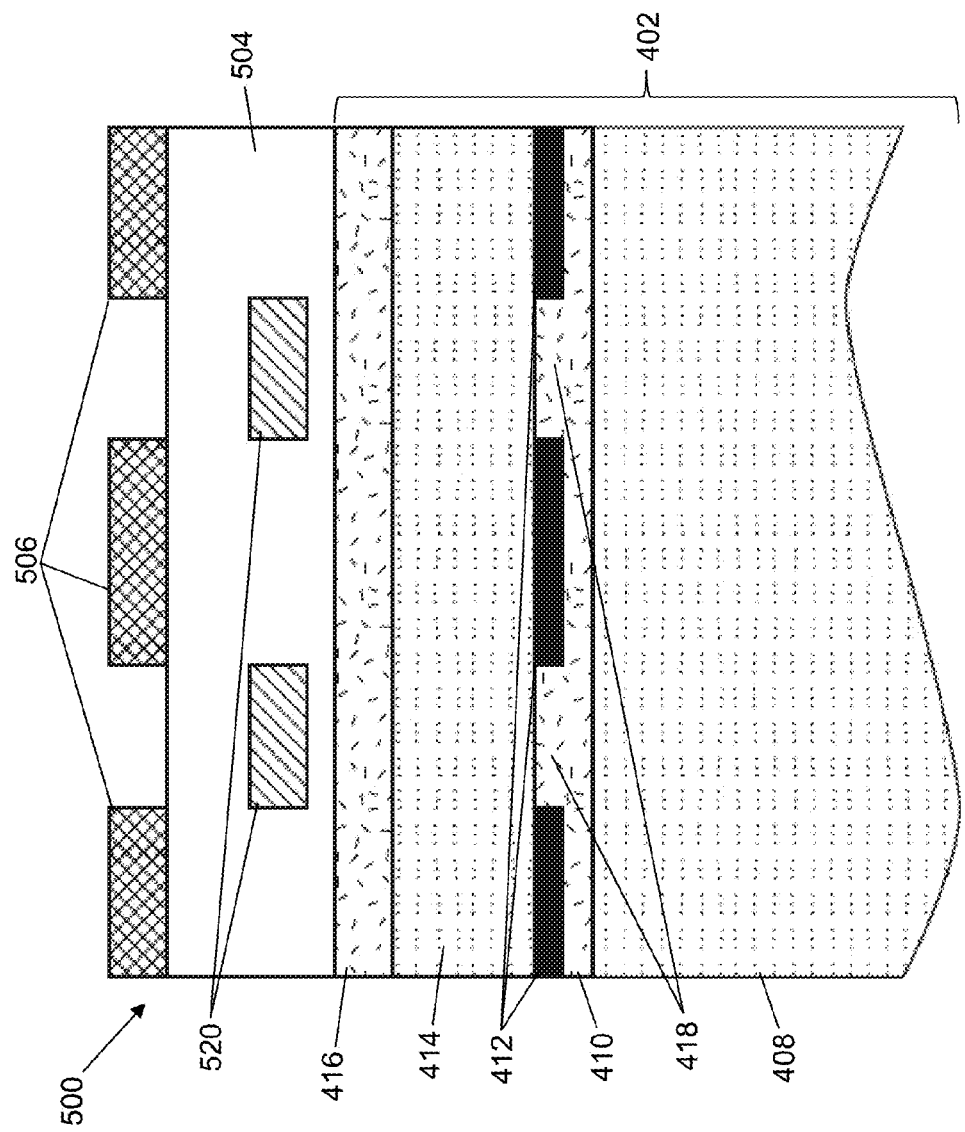

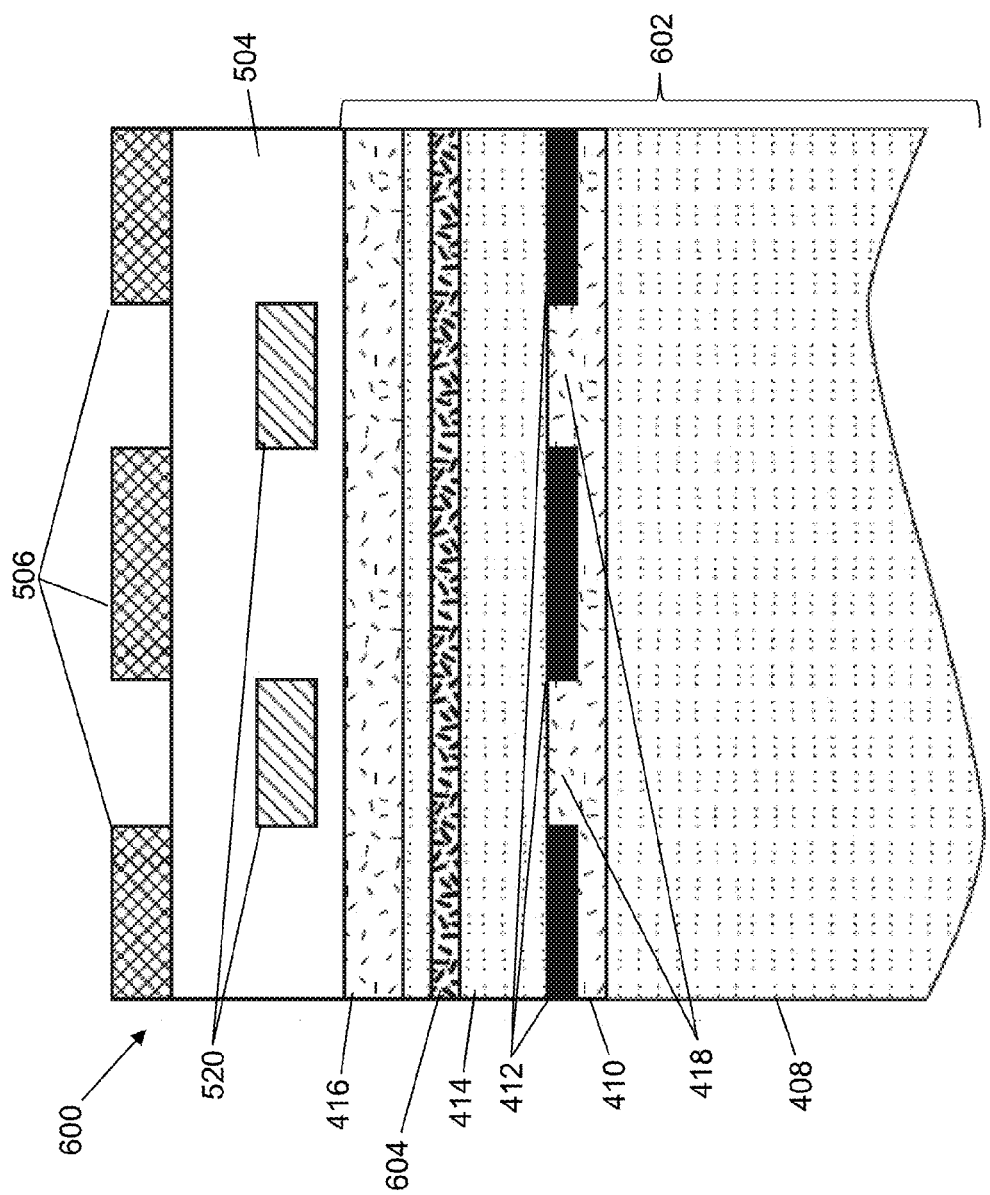

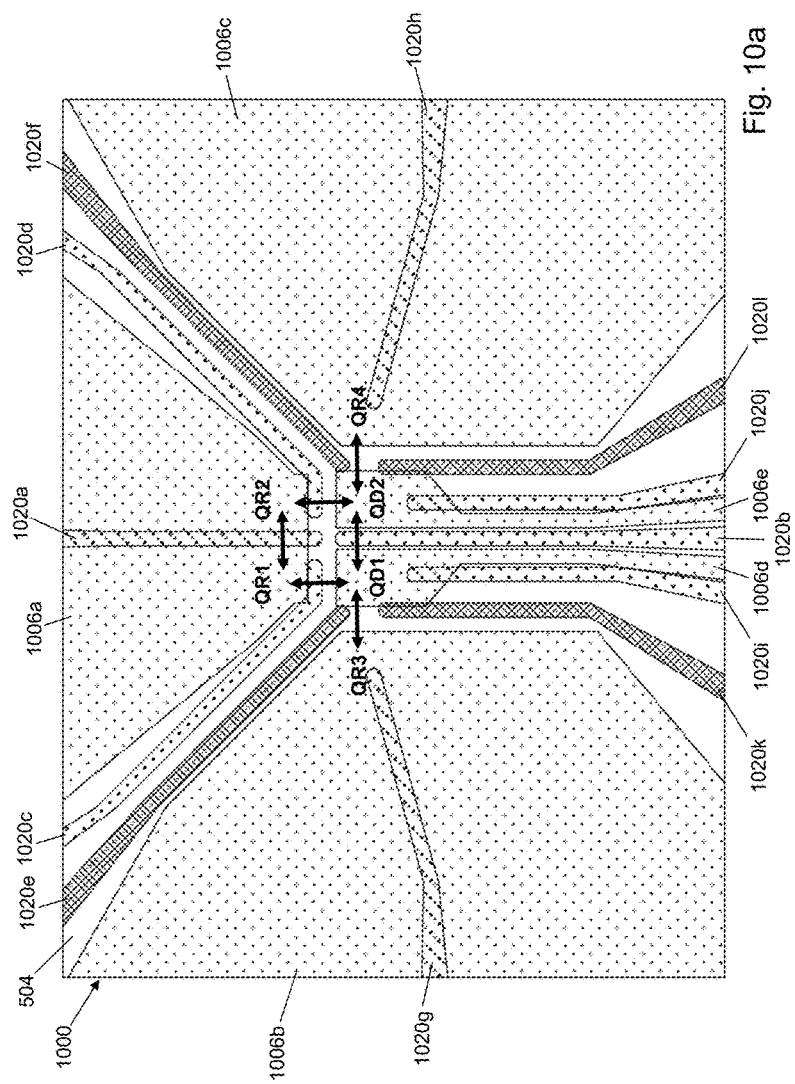

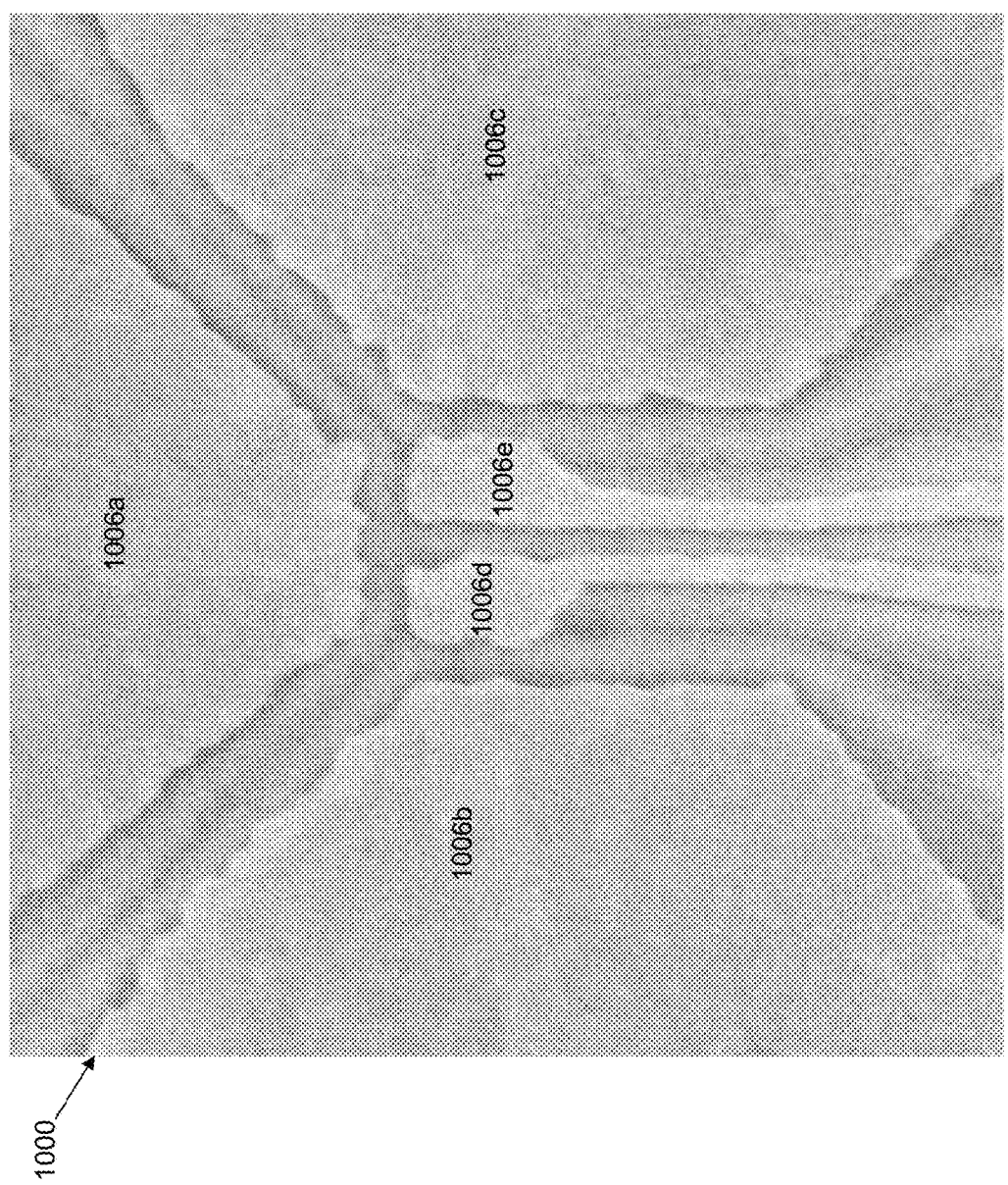

DIRECT TUNNEL BARRIER CONTROL GATES IN A TWO-DIMENSIONAL ELECTRONIC SYSTEM

CROSS-REFERENCE TO RELATED APPLICATIONS

The present application claims priority to U.S. Provisional Patent Application No. 61/782,332 that was filed Mar. 14, 2013, the entire contents of which are hereby incorporated by reference.

REFERENCE TO GOVERNMENT RIGHTS

This invention was made with government support under W911 NF-08-1-0482 and W911 NF-12-1-0607 awarded by the ARMY/ARO and HR0011-06-C-0052 and HR0011-10-C-0125 awarded by the US Department of Defense/DARPA. The government has certain rights in the invention.

BACKGROUND

As used herein, a heterostructure is a series of layers, some of which may be epitaxial, that may be chosen to allow electron or hole confinement in one or more of the layers. Epitaxial means that that the crystal structure is not interrupted at the interface between layers. A quantum heterostructure is a heterostructure in a substrate (i.e., semiconductor) where size restricts the movements of charge carriers forcing them into a quantum confinement. This leads to the formation of a set of discrete energy levels at which the carriers can exist.

A quantum confined semiconductor can be defined based on the number of electron or hole confinement dimensions. A quantum dot defines electron or hole confinement in all three dimensions. A quantum wire defines electron or hole confinement in two spatial dimensions while allowing free propagation in the third dimension. A quantum well defines electron or hole confinement in one dimension while allowing free propagation in two dimensions. By doping a quantum well or the barrier of a quantum well with donor impurities, a two-dimensional electron gas (2DEG) may be formed. Alternatively, acceptor dopants can lead to a two-dimensional hole gas (2DHG).

In general, quantum wires, wells, and dots are grown using epitaxial techniques in nanocrystals produced by chemical methods or by ion implantation or in nanodevices produced using lithographic techniques. The energy spectrum of a quantum dot can be engineered by controlling the size, shape, and strength of the confinement potential.

Quantum dot technology is one of the most promising candidates for use in solid-state quantum computing. Quantum computing utilizes quantum particles to carry out computational processes. The fundamental unit of quantum information is called a quantum bit or qubit. By applying a voltage to one or more gates formed on the quantum heterostructure, the flow of electrons through the quantum dot can be controlled and precise measurements of the spin and other properties of the electrons can be made. A qubit is a two-state quantum-mechanical system that includes an "on" state, an "off" state, and interim states that are superpositions of both the on and off states at the same time. In a quantum dot, the on/off state can be associated with an up/down spin or an energy state of the electron(s) in the quantum dot.

Quantum heterostructure previously included a multiple layer semiconductor structure having a substrate, a back gate electrode layer, a quantum well layer, a tunnel barrier layer between the quantum well layer and the back gate, and a barrier layer above the quantum well layer. Multiple electrode gates are formed on the quantum heterostructure with the gates spaced from each other by a region beneath which quantum dots can be defined. Appropriate voltages applied to the electrode gates allow the development and appropriate positioning of the quantum dots.

For illustration, a double quantum dot 100 is shown with reference to FIG. 1. Double quantum dot 100 includes a source region 102, a drain region 104, a left dot gate 106, a right dot gate 108, a left quantum dot region 110, and a right quantum dot region 112. Quantum control of electrons in double quantum dot 100 is provided primarily by adjusting the energy of electrons in left quantum dot region 110 and right quantum dot region 112 and the tunnel rate of electrons into and out of left quantum dot region 110 and right quantum dot region 112. The adjustments can be made through application of a voltage to one or more of left dot gate 106 and right dot gate 108, which change the energy within left quantum dot region 110 and right quantum dot region 112.

For further illustration, FIG. 2 shows a scanning electron microscope (SEM) image of a double quantum dot device 200 described in C. B. Simmons, et al., *Tunable spin loading and T1 of a silicon spin qubit measured by single-shot readout*, Phys. Rev. Lett. 106, 156804 (2011). Double quantum dot device 200 is a charge qubit fabricated in a Si/SiGe heterostructure. Changes in the charge states of left quantum dot region 110 and right quantum dot region 112 can be observed through measurement of a current through drain region 104 in response to voltage pulses applied to a first control gate 206. The location of tunnel barriers between source region 102 and left quantum dot region 110, between left quantum dot region 110 and right quantum dot region 112, and between right quantum dot region 112 and drain region 104 are indicated by the labels A, B, and C, respectively in FIGS. 1 and 2. Labels A, B, and C represent barriers an electron must tunnel through to travel from source region 102 to drain region 104.

In devices such as double quantum dot device 200, the gates are spatially far apart from one another, and quantum dot confinement is controlled by pinching off the intervening open channels of electrons from the sides. This pinch-off behavior adjusts the tunnel barrier height around a quantum dot as illustrated in FIG. 3. FIG. 3 shows a tunnel barrier height as a function of lateral position (from A to C) for different voltages applied to first control gate 202. A first tunnel height curve 300 results from a first voltage applied to first control gate 202. A second tunnel height curve 302 results from a second voltage applied to first control gate 202. A third tunnel height curve 304 results from a third voltage applied to first control gate 202. The third voltage is more negative than the second voltage which is more negative than the first voltage. Thus, FIG. 3 illustrates pinching off of the conduction channel at tunnel barrier A using a negative voltage applied to first control gate 202.

In traditional semiconductor dot device designs, the gates are placed directly on the surface of the heterostructure and leakage from the gate to the 2DEG is prevented by a Schottky barrier that forms between the gate and the heterostructure. Schottky barriers are only insulating under negative bias, so the electrostatic gates described with reference to FIGS. 2 and 3 can only have negative voltages applied. Furthermore, the mere presence of the gates on the surface depletes the electrons in the 2DEG underneath. This effect prevents gates from being placed too close to the desired tunnel barriers A, B, C between left quantum dot region 110 and right quantum dot region 112, since by doing so the fast tunnel rates required for device operation might not be achievable.

While these open designs have led to many successful devices for manipulating one to four quantum dots, it is challenging to tune tunnel rates while leaving the quantum dot energy levels fixed. The reason for this difficulty is that two nearby gates have similar couplings to proximal tunnel barriers and quantum dots. Thus, changing the tunnel rate while leaving the dot energy fixed is not achievable by changing the voltage applied to a single gate, but rather involves changing the voltages of multiple nearby gates in a complicated compensation process that becomes more challenging as the number of dots in a device increases.

SUMMARY

A quantum semiconductor device is provided. The quantum semiconductor device includes a quantum heterostructure, a dielectric layer, and an electrode. The quantum heterostructure includes a quantum well layer that includes a first 2DEG region, a second 2DEG region, and a third 2DEG region. A first tunnel barrier exists between the first 2DEG region and the second 2DEG region. A second tunnel barrier exists between the second 2DEG region and the third 2DEG region. A third tunnel barrier exists either between the first 2DEG region and the third 2DEG region. The dielectric layer is formed on the quantum heterostructure. The electrode is formed on the dielectric layer directly above the first tunnel barrier.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 5a is a cross-sectional schematic view of a second quantum semiconductor device in accordance with an illustrative embodiment.

FIG. 6 is a cross-sectional schematic view of the quantum semiconductor device of FIG. 5a with a second heterostructure in accordance with an illustrative embodiment.

FIG. 10a is a top schematic view of a third quantum semiconductor device in accordance with an illustrative embodiment.

FIG. 10c is a SEM image of the third quantum semiconductor device of FIG. 10a in accordance with an illustrative embodiment.

FIG. 11 is a graph showing a source-drain current as a function of plunger gate voltages and a source-drain bias for the third quantum semiconductor device of FIG. 10a.

FIG. 12 is a graph showing a comparison of the source-drain current as a function of the plunger gate voltages and top lower gate voltages for the third quantum semiconductor device of FIG. 10a.

FIG. 13 is a graph showing the source-drain current as a function of the plunger gate voltages and the bottom upper gate voltages taken at a source-drain bias of 50 µV for the third quantum semiconductor device of FIG. 10a.

FIG. 14 is a graph showing the source-drain current as a function of the plunger gate voltages and top lower gate voltages taken at a source-drain bias of 50 µV for the third quantum semiconductor device of FIG. 10a.

FIG. 15 is a graph showing a right dot to reservoir loading tunnel frequency as a function of a top right lower gate voltage for the third quantum semiconductor device of FIG. 10a.

FIG. 16 is a graph showing a left dot to reservoir loading tunnel frequency as a function of a top left lower gate voltage for the third quantum semiconductor device of FIG. 10a.

FIG. 17 is a graph showing an inter-dot tunnel rate as a function of a bottom center lower gate voltage for the third quantum semiconductor device of FIG. 10a.

DETAILED DESCRIPTION

Figure 4A:
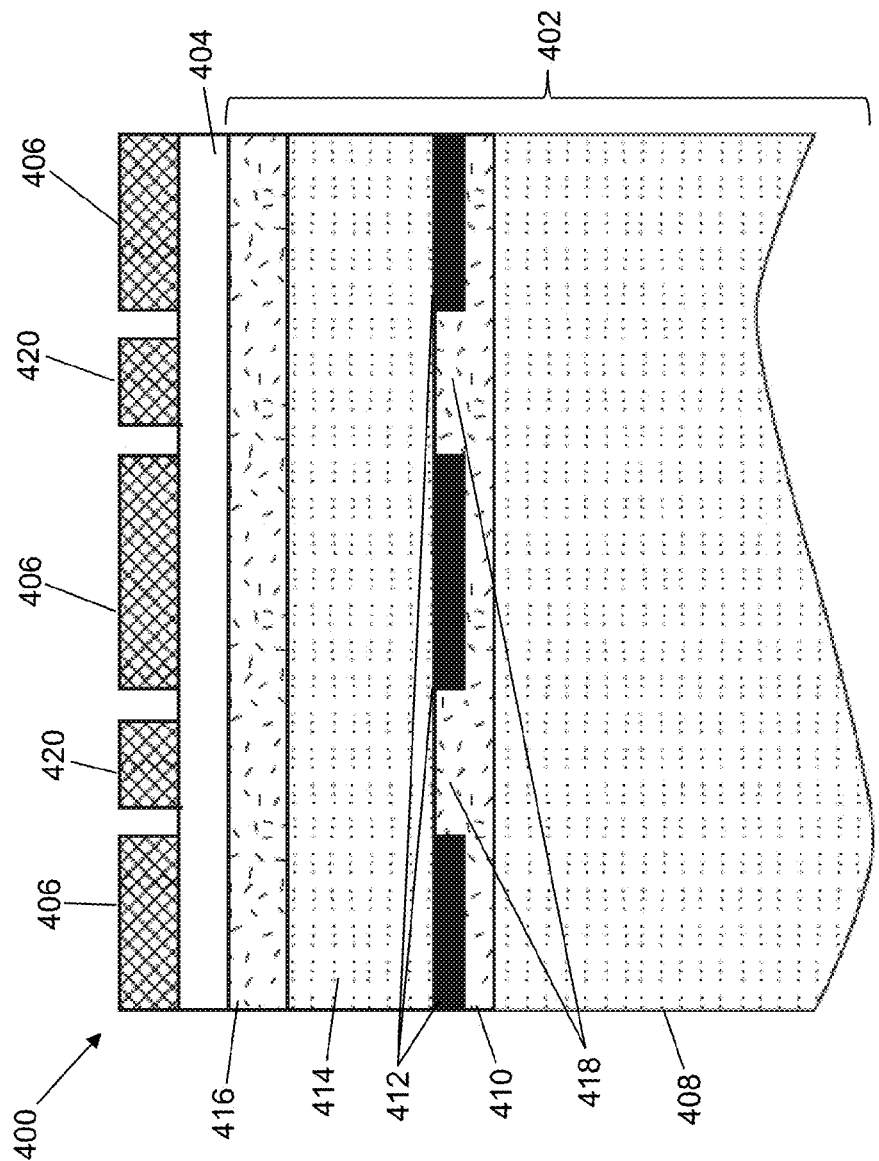
FIG. 4a is a cross-sectional schematic view of a quantum semiconductor device in accordance with an illustrative embodiment.
Figure 4B:
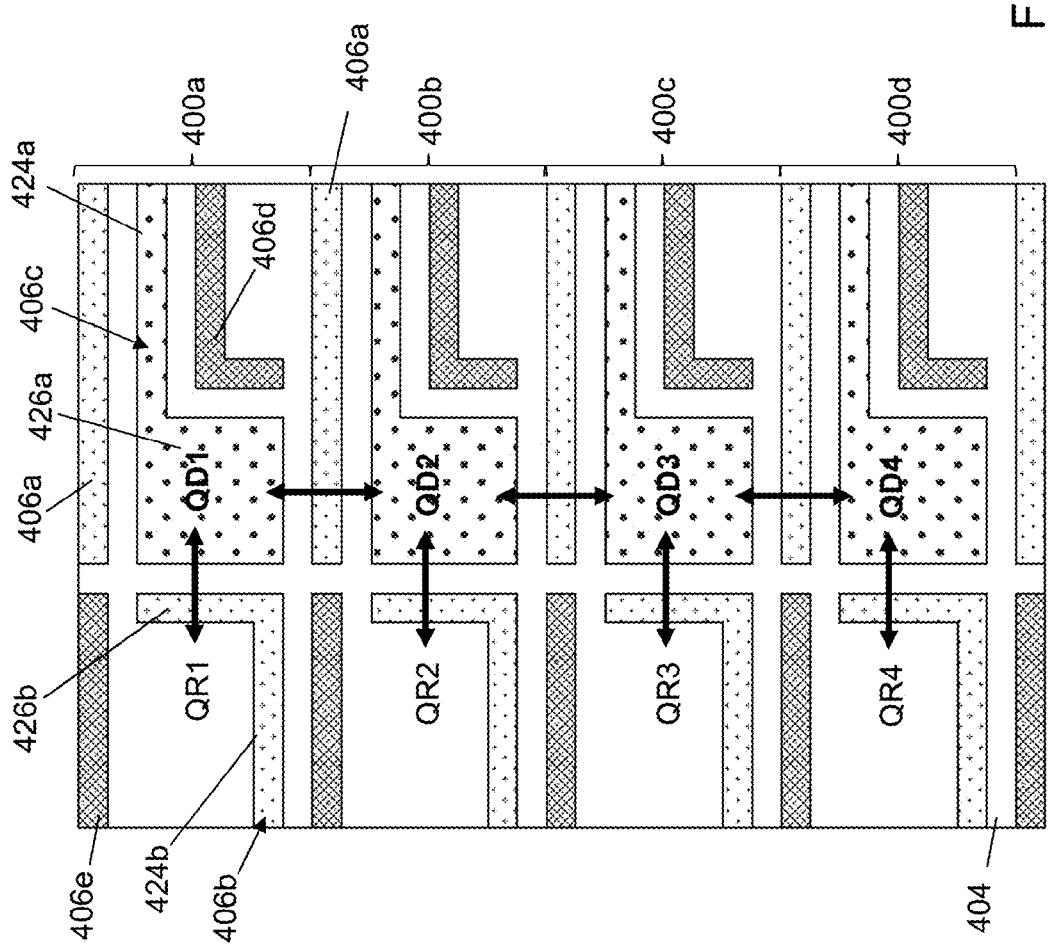
FIG. 4b is a top schematic view of the quantum semiconductor device of FIG. 4a in accordance with an illustrative embodiment.
Figure 4C:
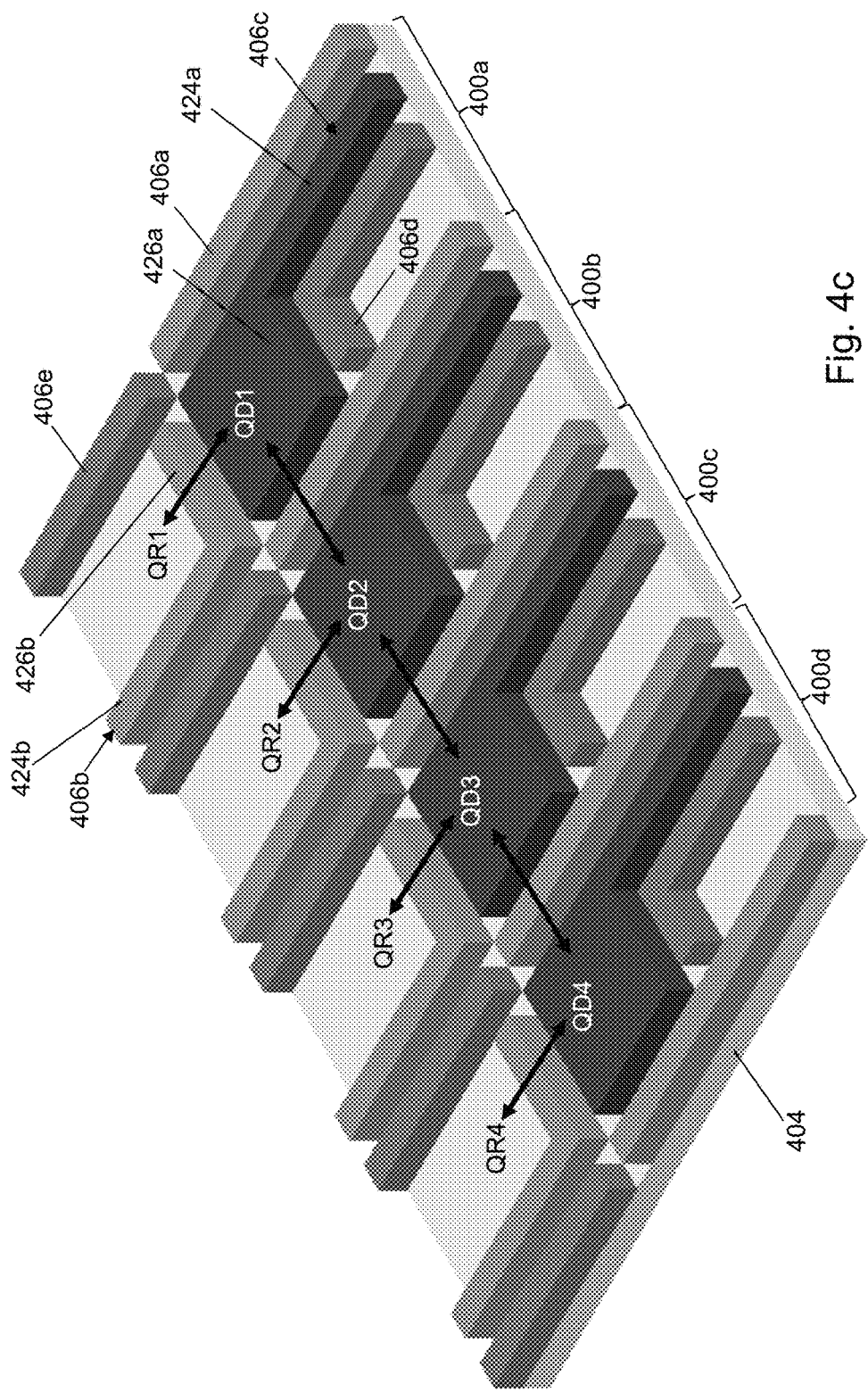
FIG. 4c is a perspective, schematic view of the quantum semiconductor device of FIG. 4a in accordance with an illustrative embodiment.

With reference to FIGS. 4a-4c, a quantum semiconductor device 400 is shown in accordance with an illustrative embodiment. Quantum semiconductor device 400 is a four quantum dot device that includes direct tunnel barrier control gates between each quantum device and between electron reservoirs for the quantum dot devices in accordance with a first illustrative embodiment. FIG. 4a shows a partial cross-sectional view of quantum semiconductor device 400 to illustrate the layers that make up quantum semiconductor device 400. FIG. 4b shows a top surface view of quantum semiconductor device 400. FIG. 4c shows a perspective view of the top layers of quantum semiconductor device 400.

With reference to FIG. 4a, quantum semiconductor device 400 may include a quantum heterostructure 402, a dielectric layer 404, a first plurality of electrodes 406, and a second plurality of electrodes 420. In the illustrative embodiment of FIG. 4a, quantum heterostructure 402 includes a first tunnel barrier layer 408, a quantum well layer 410, a plurality of 2DEG regions 412, a second tunnel barrier layer 414, and a cap layer 416. The plurality of 2DEG regions 412 are formed within quantum well layer 410. Tunnel barriers 418 in are formed in quantum well layer 410 between adjacent 2DEG regions of the plurality of 2DEG regions 412. Quantum well layer 410 and cap layer 416 may be formed of Si. In an illustrative embodiment, quantum well layer 410 has a thickness in the range of about 8 nanometers (nm) to 20 nm. In an illustrative embodiment, cap layer 416 has a thickness in the range of about 1 nm to 5 nm.

First tunnel barrier layer 408 and quantum well layer 410 may form a single layer. Second tunnel barrier layer 414 and quantum well layer 410 may form a single layer. First tunnel barrier layer 408 and second tunnel barrier layer 414 may be formed of a material selected to act as a barrier to migration of electrons from the plurality of 2DEG regions 412 into first tunnel barrier layer 408 and into second tunnel barrier layer 414. For example, first tunnel barrier layer 408 and second tunnel barrier layer 414 may be formed of SiGe. In an illustrative embodiment, first tunnel barrier layer 408 has a thickness in the range of about 200 nm 5000 nm. In an illustrative embodiment, second tunnel barrier layer 414 has a thickness in the range of about 20 nm to 100 nm.

Dielectric layer 404 is a thin layer of dielectric material. In an illustrative embodiment, dielectric layer 404 has a thickness in the range of about 5 nm to 20 nm. In an illustrative embodiment, dielectric layer 404 may be formed using an oxide material such as aluminum oxide ($Al_2O_3$) or hafnium(IV) oxide ($HfO_2$). Dielectric layer 404 creates a tunnel barrier between the electrodes 406, 420 and the plurality of 2DEG regions 412 to prevent leakage currents from flowing between the electrodes 406, 420 and the plurality of 2DEG regions 412 when either negative or positive voltages are applied to the first plurality of electrodes 406 and/or the second plurality of electrodes 420.

The multiple layers of quantum semiconductor device 400 can be formed using conventional deposition systems, including low pressure chemical vapor deposition (CVD) or formed using lithography techniques such as x-ray lithography, photolithography, electron beam lithography, etc. using a wide variety of etches. In an illustrative embodiment, layers 408, 410, 414, and 416 are grown sequentially, such as via chemical vapor deposition. Dielectric layer 404 is deposited via atomic layer deposition (ALD). The plurality of electrodes 406 and 420 are patterned with e-beam lithography in an e-beam resist and the electrodes are deposited via e-beam evaporation of titanium and gold and lift-off of the excess metal.

Unlike traditional designs, the first plurality of electrodes 406 and the second plurality of electrodes 420 are not formed directly on the semiconductor surface, but are formed on dielectric layer 404. The first plurality of electrodes 406 and the second plurality of electrodes 420 can be patterned onto dielectric layer 404 on very small scales, e.g., lateral dimension of 40 nm or less by metal deposition and lift-off in a conventional manner. In an illustrative embodiment, the first plurality of electrodes 406 and the second plurality of electrodes 420 have a thickness in the range of about 20 nm to 80 nm. A distance between adjacent ones of the first plurality of electrodes 406 and the second plurality of electrodes 420 is in the range of about 20 nm to 200 nm.

In the illustrative embodiment, the first plurality of electrodes 406 and the second plurality of electrodes 420 are formed of a conductive material such as a metallic material though the material need not be a metal. For example, highly doped semiconductors such as Si or GaAs can be used.

When a sufficiently high positive voltage is applied to the second plurality of electrodes 420, electrons can be accumulated underneath the second plurality of electrodes 420, which are placed directly over tunnel barriers 418 between the plurality of 2DEG regions 412. Application of positive (or negative) voltages to the second plurality of electrodes 420 can be used to tune the tunnel rate of electrons through tunnel barriers 418 exponentially as a function of the voltage applied. Preferably, selected voltages can be applied individually to each of the first plurality of electrodes 406 and the second plurality of electrodes 420 to control quantum dot energy and tunnel rates. The first plurality of electrodes 406 and the second plurality of electrodes 420 can be made positive (accumulating) or negative (depleting).

With reference to the illustrative embodiment of FIGS. 4b and 4c, quantum semiconductor device 400 includes a first quantum dot device 400a, a second quantum dot device 400b, a third quantum dot device 400c, and a fourth quantum dot device 400d. Each quantum dot device is formed using a similar arrangement of electrodes formed on dielectric layer 404. As a result, only the first quantum dot device 400a is described.

The various electrodes formed on dielectric layer 404 are arranged to define quantum dot regions within which the energy level and spin of electrons can be manipulated. Positive and negative voltages applied to the various electrodes control entanglement between electrons in the quantum dot regions and the movement of the electrons within quantum well layer 410. Though all of the electrodes in FIGS. 4b and 4c are identified using a reference number 406, some of the first plurality of electrodes 406 form the second plurality of electrodes 420 shown with reference to FIG. 4a. The second plurality of electrodes 420 are a first subset of the first plurality of electrodes 406 formed directly over tunnel barriers 418. Additionally, a second subset of the first plurality of electrodes 406 form a third plurality of electrodes that are positioned directly over some of the quantum dot regions. The third plurality of electrodes control accumulation and/or depletion of electrons in the quantum dot regions of quantum well layer 410. A third subset of the first plurality of electrodes 406 comprise the remaining electrodes that are not included in the first subset or the second subset. The third subset of the first plurality of electrodes 406 prevent leakage from one area of quantum semiconductor device 400 to another. Positive or negative voltages may be applied to any of the first plurality of electrodes 406.

The quantum dot regions formed by quantum semiconductor device 400 are referenced as QD1, QD2, QD3, QD4 in FIGS. 4b and 4c. Directional arrows indicate the location of tunnel barriers through which the electrons can move between the quantum dot regions QD1, QD2, QD3, QD4. The quantum dot reservoir regions are referenced as QR1, QR2, QR3, QR4 in FIGS. 4b and 4c. Directional arrows also indicate the location of tunnel barriers through which the electrons can move between the respective quantum dot reservoir region and quantum dot region.

First quantum dot device 400a includes a first electrode 406a, a second electrode 406b, a third electrode 406c, a fourth electrode 406d, and a fifth electrode 406e. Each of first electrode 406a, second electrode 406b, third electrode 406c, fourth electrode 406d, and fifth electrode 406e is formed on dielectric layer 404. First electrode 406a has a generally elongated rectangular shape on the surface of dielectric layer 404 and forms a first edge of first quantum dot device 400a. First electrode 406a further is a first electrode of the second plurality of electrodes 420.

Fifth electrode 406e has a generally elongated rectangular shape on the surface of dielectric layer 404 and forms a second edge of first quantum dot device 400a. First electrode 406a and fifth electrode 406e are aligned and separated by a gap.

Second electrode 406b, third electrode 406c, and fourth electrode 406d form L-shapes on the surface of dielectric layer 404. Second electrode 406b has a first elongated rectangular portion 424b and a second elongated rectangular portion 426b. First elongated rectangular portion 424b is shaped similarly to and parallel with fifth electrode 406e and forms a third edge of first quantum dot device 400a opposite the second edge. Second elongated rectangular portion 426b extends in a generally perpendicular direction to first elongated rectangular portion 424b to form the L-shape. Because second elongated rectangular portion 426b is positioned over a tunnel barrier of the tunnel barriers 418, second electrode 406b forms a second electrode of the second plurality of electrodes 420.

Third electrode 406c has a first elongated rectangular portion 424a and a second rectangular portion 426a. First elongated rectangular portion 424a is shaped similarly to and parallel with first electrode 406a. Second rectangular portion 426a extends in a generally perpendicular direction to first elongated rectangular portion 424a to form the L-shape. Second rectangular portion 426a has a generally square shape. Second rectangular portion 426a is positioned directly over QD1 to control accumulation and/or depletion of electrons in quantum well layer 410 below second rectangular portion 426a of third electrode 406c. Because second rectangular portion 426a is positioned over the region denoted QD1, third electrode 406c forms a first electrode of the third plurality of electrodes.

In an illustrative embodiment, fourth electrode 406d and fifth electrode 406e can be held at a fixed negative voltage to prevent leakage from one area to an adjacent area while a positive voltage is applied to third electrode 406c to accumulate electrons in QD1. A positive or negative voltage applied to first electrode 406a and/or to second electrode 406b exponentially controls the tunnel rate through the tunnel barrier directly below each electrode 406a, 406b.

Figure 5B:
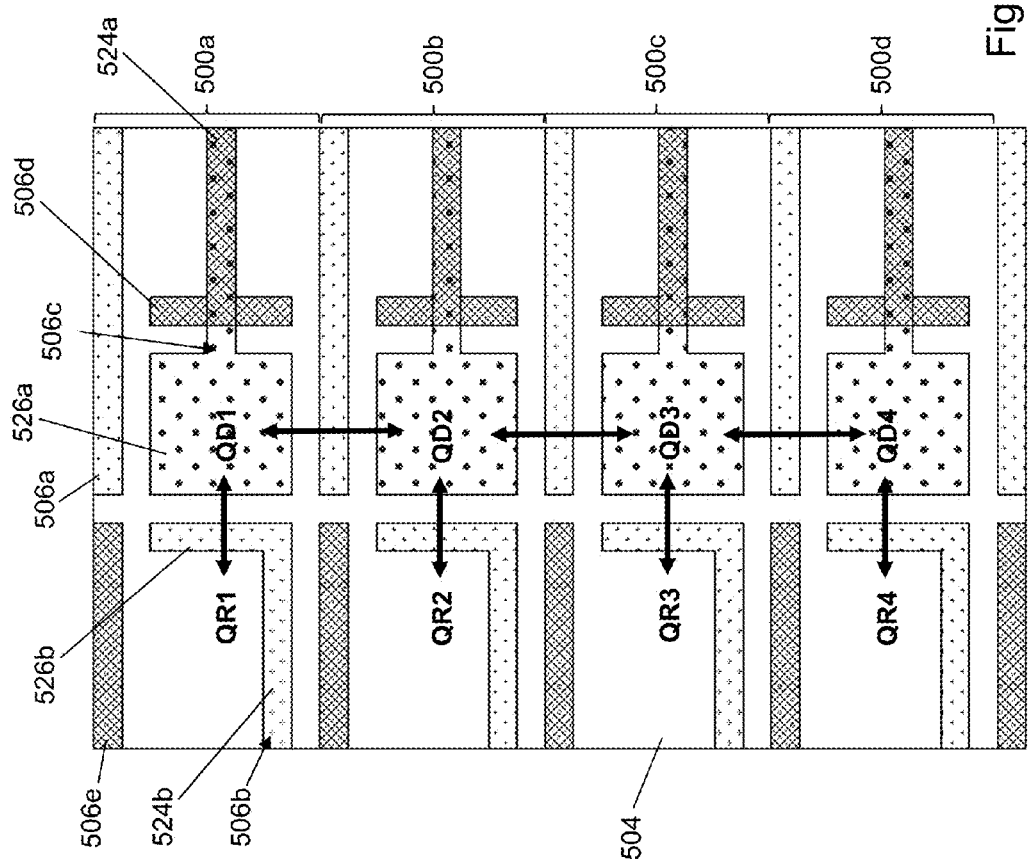
FIG. 5b is a top schematic view of the second quantum semiconductor device of FIG. 5a in accordance with an illustrative embodiment.
Figure 5C:
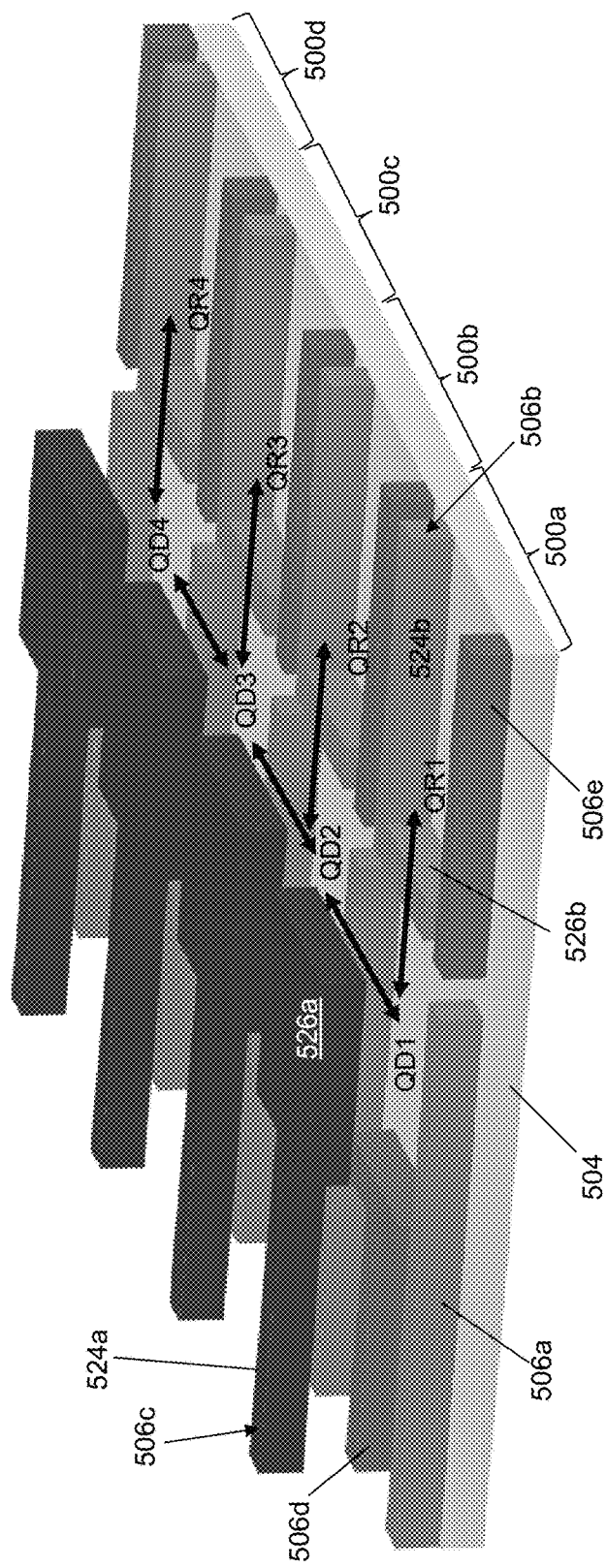
FIG. 5c is a perspective, schematic view of the second quantum semiconductor device of FIG. 5a in accordance with an illustrative embodiment.

With reference to FIGS. 5a-5c, a second quantum semiconductor device 500 is shown in accordance with an illustrative embodiment. Quantum semiconductor device 500 is a four quantum dot device that includes direct tunnel barrier control gates between each quantum device and between electron reservoirs for the quantum dot devices in accordance with a second illustrative embodiment. FIG. 5a shows a partial cross-sectional view of second quantum semiconductor device 500 to illustrate the layers that make up second quantum semiconductor device 500. FIG. 5b shows a top surface view of second quantum semiconductor device 500. FIG. 5c shows a perspective view of the top layers of second quantum semiconductor device 500.

With reference to FIG. 5a, second quantum semiconductor device 500 may include quantum heterostructure 402, a second dielectric layer 504, a first plurality of electrodes 506, and a second plurality of electrodes 520. Second dielectric layer 504 is formed of dielectric material. In an illustrative embodiment, second dielectric layer 504 has a thickness in the range of about 40 nm to 100 nm. The distance between the first plurality of electrodes 506 and the second plurality of electrodes 520 is defined by the amount of dielectric required to prevent leakage between the two layers. This is further a function of the dielectric material, dielectric quality, and the desired voltage difference between the two layers. As an example, using $Al_2O_3$ as the dielectric material deposited via atomic layer deposition, a thickness of approximately 60 nm may be used. Second dielectric layer 504 is otherwise similar to dielectric layer 404. The first plurality of electrodes 506 are formed on the surface of second dielectric layer 504. The second plurality of electrodes 520 are formed within second dielectric layer 504. The first plurality of electrodes 406 and the second plurality of electrodes 420 are otherwise similar to the first plurality of electrodes 406 and the second plurality of electrodes 420 of quantum semiconductor device 400 described with reference to FIGS. 4a-4c.

With reference to the illustrative embodiment of FIGS. 5b and 5c, second quantum semiconductor device 500 includes a first quantum dot device 500a, a second quantum dot device 500b, a third quantum dot device 500c, and a fourth quantum dot device 500d. For clarity, the portions of second dielectric layer 504 between the first plurality of electrodes 406 and the second plurality of electrodes 420 are not shown in FIG. 5c. Each quantum dot device is formed using a similar arrangement of electrodes formed on second dielectric layer 504. As a result, only first quantum dot device 500a is described.

Though all of the electrodes in FIGS. 5b and 5c are identified using a reference number 506, some of the first plurality of electrodes 506 form the second plurality of electrodes 520 shown with reference to FIG. 5a. The second plurality of electrodes 520 are a first subset of the first plurality of electrodes 506 formed directly over tunnel barriers 418. Additionally, a second subset of the first plurality of electrodes 506 form a third plurality of electrodes that are positioned directly over some of the quantum dot regions. The third plurality of electrodes further control accumulation and/or depletion of electrons in the quantum dot regions of quantum well layer 410. A third subset of the first plurality of electrodes 506 comprise the remaining electrodes that are not included in the first subset or the second subset. The third subset of the first plurality of electrodes 506 prevent leakage from one area to another. Positive or negative voltages may be applied to any of the first plurality of electrodes 506.

The quantum dot regions formed by second quantum semiconductor device 500 are referenced as QD1, QD2, QD3, QD4 in FIGS. 5b and 5c. Directional arrows indicate the location of tunnel barriers through which the electrons can move between the quantum dot regions QD1, QD2, QD3, QD4. The quantum dot reservoir regions are referenced as QR1, QR2, QR3, QR4 in FIGS. 5b and 5c. Directional arrows also indicate the location of tunnel barriers through which the electrons can move between the respective quantum dot reservoir region and quantum dot region.

First quantum dot device 500a includes a first electrode 506a, a second electrode 506b, a third electrode 506c, a fourth electrode 506d, and a fifth electrode 506e. Each of first electrode 506a, second electrode 506b, fourth electrode 506d, and fifth electrode 506e is formed within second dielectric layer 504. Third electrode 506c is formed on the surface of second dielectric layer 504. First electrode 506a has a generally elongated rectangular shape on the surface of second dielectric layer 504 and forms a first edge of first quantum dot device 500a. First electrode 506a further is a first electrode of the second plurality of electrodes 520.

Fifth electrode 506e has a generally elongated rectangular shape on the surface of second dielectric layer 504 and forms a second edge of first quantum dot device 500a. First electrode 56a and fifth electrode 506e are aligned and separated by a gap.

Second electrode 506b forms an L-shape on the surface of second dielectric layer 504. Second electrode 506b has a first elongated rectangular portion 524b and a second elongated rectangular portion 526b. First elongated rectangular portion 524b is shaped similarly to and parallel with fifth electrode 506e and forms a third edge of first quantum dot device 500a opposite the second edge. Second elongated rectangular portion 526b extends in a generally perpendicular direction to first elongated rectangular portion 524b to form the L-shape. Because second elongated rectangular portion 526b is positioned over a tunnel barrier of the tunnel barriers 418, second electrode 506b forms a second electrode of the second plurality of electrodes 520.

Third electrode 506c and fourth electrode 506d form T-shapes on the surface of second dielectric layer 504. Third electrode 506c has a first elongated rectangular portion 524a and a second rectangular portion 526a. First elongated rectangular portion 524a is shaped similarly to and parallel with first electrode 506a. Second rectangular portion 526a extends in generally perpendicular directions from first elongated rectangular portion 524a to form the T-shape. Second rectangular portion 526a has a generally square shape. Second rectangular portion 526a is positioned directly over QD1 to control accumulation and/or depletion of electrons in quantum well layer 410 below second rectangular portion 526a of third electrode 506c. Because second rectangular portion 526a is positioned over the region denoted QD1, third electrode 406c forms a first electrode of the third plurality of electrodes.

In an illustrative embodiment, fourth electrode 506d and fifth electrode 506e can be held at a fixed negative voltage to prevent leakage from one area to an adjacent area while a positive voltage is applied to third electrode 506c to accumulate electrons in QD1. A positive or negative voltage applied to first electrode 506a and/or to second electrode 506b exponentially controls the tunnel rate through the tunnel barrier directly below each electrode 506a, 506b.

With reference to the illustrative embodiment of FIGS. 4a and 5a, quantum heterostructure 402 is described as an undoped Si/SiGe heterostructure. Many other semiconducting heterostructures can be used in alternative embodiments. Such alternative heterostructures support the formation of the plurality of 2DEG regions 412. For example, with reference to FIG. 6, a doped Si/SiGe heterostructure is shown.

Figure 7:
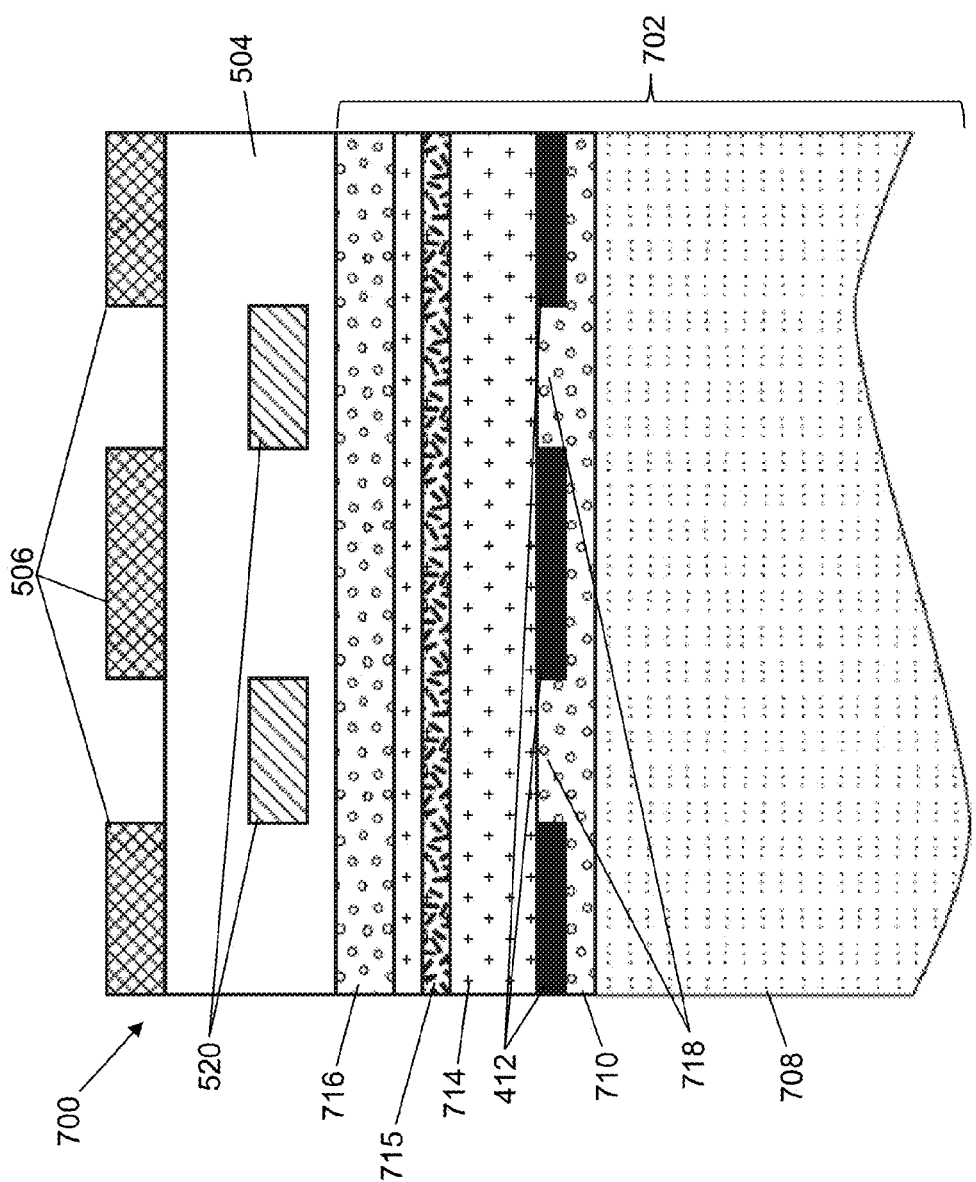
FIG. 7 is a cross-sectional schematic view of the quantum semiconductor device of FIG. 5a with a third heterostructure in accordance with an illustrative embodiment.

With reference to FIG. 6, a third quantum semiconductor device 600 may include a second quantum heterostructure 602, second dielectric layer 504, the first plurality of electrodes 506, and the second plurality of electrodes 520. Second quantum heterostructure 602 includes first tunnel barrier layer 408, quantum well layer 410, the plurality of 2DEG regions 412, second tunnel barrier layer 414, and cap layer 416. Second tunnel barrier layer 414 includes a dopant material 604. For example, second tunnel barrier layer 414 can contain phosphorous, an n-type dopant, which populates the plurality of 2DEG regions 412 with electrons As another example, with reference to FIG. 7, a doped GaAs heterostructure is shown. With reference to FIG. 7, a fourth quantum semiconductor device 700 may include a third quantum heterostructure 702, second dielectric layer 504, the first plurality of electrodes 506, and the second plurality of electrodes 520. In the illustrative embodiment of FIG. 7, third quantum heterostructure 702 includes a substrate layer 708, a quantum well layer 710, the plurality of 2DEG regions 412, a second tunnel barrier layer 714, and a cap layer 716. Second dielectric layer 504 is formed on cap layer 716. Tunnel barriers 718 are formed within quantum well layer 710 between adjacent 2DEG regions of the plurality of 2DEG regions 412.

Cap layer 716 may be formed of GaAs. In an illustrative embodiment, cap layer 716 has a thickness in the range of about 5 nm to 20 nm. In an illustrative embodiment, quantum well layer 710 may be formed of GaAs buffer.

Though GaAs/AlGaAs heterostructures can include a first tunnel barrier region below quantum well layer 710, GaAs/AlGaAs heterostructures usually do not include such a structure. Thus, substrate layer 708 may be formed of any substrate material. In an illustrative embodiment, substrate layer 708 has a thickness in the range of about 200 nm to 5000 nm.

Second tunnel barrier layer 714 may be formed of $Al_xGa_{1-x}As$. In an illustrative embodiment, second tunnel barrier layer 714 has a thickness in the range of about 30 nm to 80 nm. Second tunnel barrier layer 714 includes a dopant material 715, which is typically Si, an n-type dopant.

In an alternative embodiment not shown, second tunnel barrier layer 714 does not include dopant material 715, and substrate layer 708 includes quantum well layer 710 formed of GaAs such that the plurality of 2DEG regions 412 are formed at the interface of second tunnel barrier layer 714.

Figure 8:
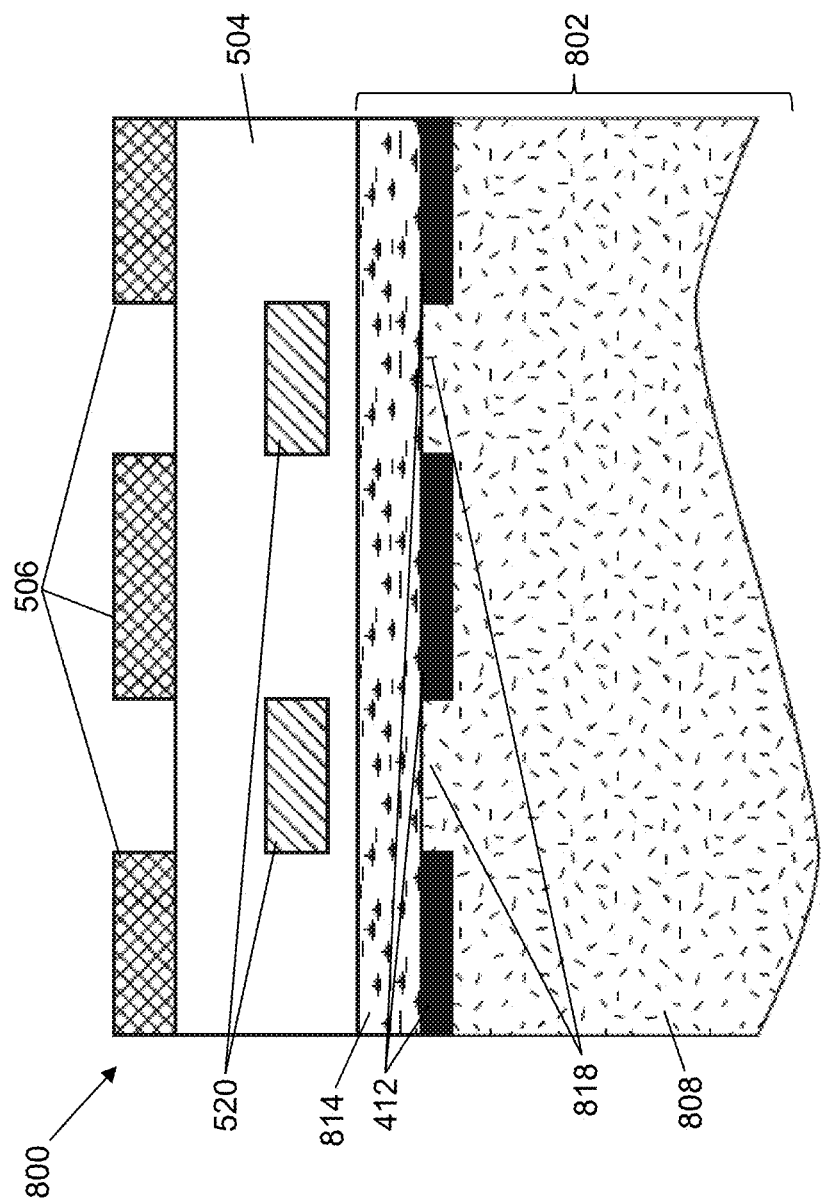
FIG. 8 is a cross-sectional schematic view of the quantum semiconductor device of FIG. 5a with a fourth heterostructure in accordance with an illustrative embodiment.

As yet another example, with reference to FIG. 8, a gated semiconductor heterostructure is shown. With reference to FIG. 8, a fifth quantum semiconductor device 800 may include a fourth quantum heterostructure 802, second dielectric layer 504, the first plurality of electrodes 506, and the second plurality of electrodes 520. In the illustrative embodiment of FIG. 8, fourth quantum heterostructure 802 includes a substrate layer 808, the plurality of 2DEG regions 412, and a second tunnel barrier layer 814. Second dielectric layer 504 is formed on second tunnel barrier layer 814. Tunnel barriers 818 are formed within substrate layer 808 between adjacent 2DEG regions of the plurality of 2DEG regions 412.

Substrate layer 808 includes the quantum well layer 710 such that the plurality of 2DEG regions 412 are formed at the interface of second tunnel barrier layer 814. Substrate layer 808 may be formed of Si. In an illustrative embodiment, substrate layer 808 has a thickness in the range of about 200 nm to 0.5 millimeters (mm). Second tunnel barrier layer 814 may be formed of $SiO_2$. In an illustrative embodiment, second tunnel barrier layer 814 has a thickness in the range of about 20 nm to 300 nm.

Figure 9:
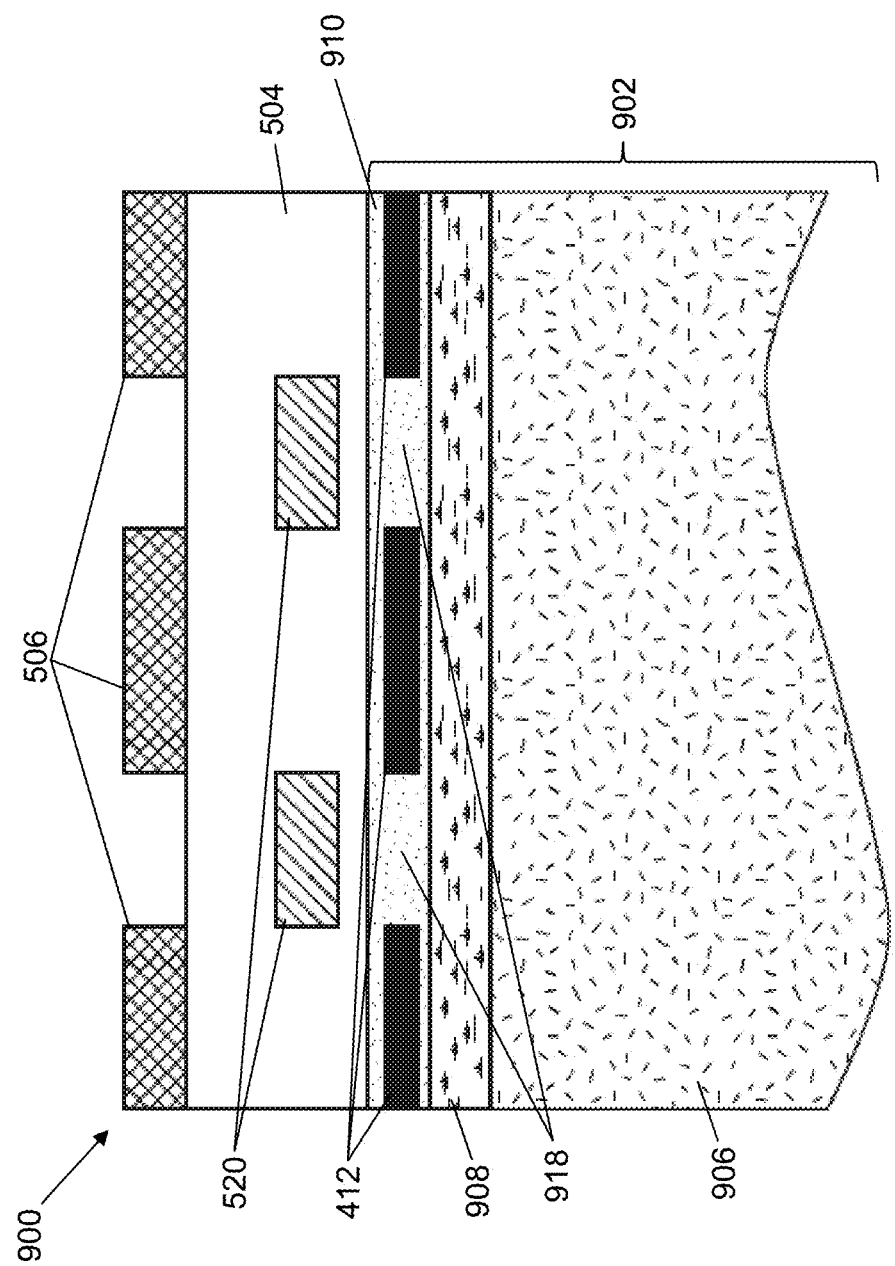
FIG. 9 is a cross-sectional schematic view of the quantum semiconductor device of FIG. 5a with a fifth heterostructure in accordance with an illustrative embodiment.

As still another example, with reference to FIG. 9, a graphene heterostructure is shown. With reference to FIG. 9, a sixth quantum semiconductor device 900 may include a fifth quantum heterostructure 902, second dielectric layer 504, the first plurality of electrodes 506, and the second plurality of electrodes 520. In the illustrative embodiment of FIG. 9, fifth quantum heterostructure 902 includes a back gate layer 906, a first tunnel barrier layer 908, a quantum well layer 910, and the plurality of 2DEG regions 412.

Second dielectric layer 504 is formed on quantum well layer 910. Tunnel barriers 918 are formed within quantum well layer 910 between adjacent 2DEG regions of the plurality of 2DEG regions 412.

Back gate layer 906 may be formed of Si. In an illustrative embodiment, back gate layer 906 has a thickness of about 0.5 mm. First tunnel barrier layer 908 may be formed of $SiO_2$. In an illustrative embodiment, first tunnel barrier layer 908 has a thickness of about 300 nm. Quantum well layer 910 may be formed of graphene. In an illustrative embodiment, quantum well layer 910 is comprised of one to several atomic layers of grapheme.

Various quantum heterostructures have been provided as examples on which dielectric layer 404 or second dielectric layer 504 can be formed. It should be understood that in addition to the Si and GaAs heterostructures described, any III-V semiconductor, such as InAs, or II-VI can be used.

Figure 10B:
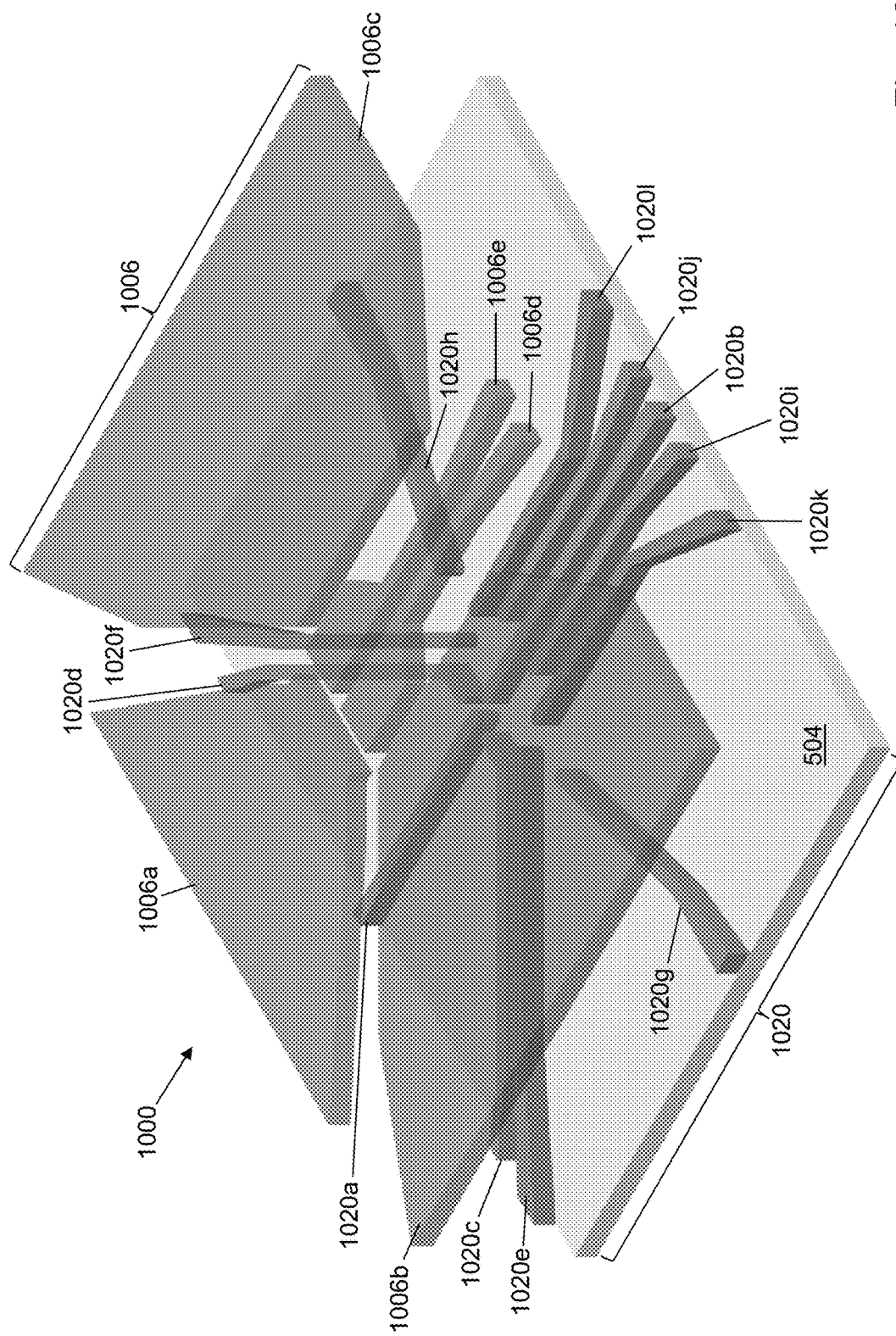
FIG. 10b is a perspective, schematic view of the third quantum semiconductor device of FIG. 10a in accordance with an illustrative embodiment.

With reference to FIGS. 10a-10c, a seventh quantum semiconductor device 1000 is shown in accordance with an illustrative embodiment. Seventh quantum semiconductor device 1000 is a double quantum dot device that includes direct tunnel barrier control gates between each quantum dot and between the electron reservoirs for the quantum dots in accordance with a third illustrative embodiment. Seventh quantum semiconductor device 1000 may be formed on any of the heterostructures 402, 602, 702, 802, 902. FIG. 10a shows a top surface view of seventh quantum semiconductor device 1000. FIG. 10b shows a perspective view of the top layers of seventh quantum semiconductor device 1000. FIG. 10c shows a SEM image of seventh quantum semiconductor device 1000.

With reference to FIGS. 10a and 10b, seventh quantum semiconductor device 1000 may include second dielectric layer 504, a first plurality of electrodes 1006, and a second plurality of electrodes 1020. The first plurality of electrodes 1006 are formed on the surface of second dielectric layer 504. The second plurality of electrodes 1020 are formed within second dielectric layer 504. For clarity, the portions of second dielectric layer 504 between the first plurality of electrodes 1006 and the second plurality of electrodes 1020 are not shown in FIG. 10b. The first plurality of electrodes 1006 and the second plurality of electrodes 1020 are otherwise similar to the first plurality of electrodes 406 and the second plurality of electrodes 420 of quantum semiconductor device 400 described with reference to FIG. 4a.

The first plurality of electrodes 1006 and the second plurality of electrodes 1020 form quantum dot regions QD1 and QD2. Directional arrows indicate the location of tunnel barriers through which the electrons can move between the quantum dot regions QD1 and QD2 as well as between the quantum dot regions QD1, QD2 and reservoir regions QR1, QR2, QR3, and QR4. A directional arrow also indicates the location of a tunnel barrier through which the electrons can move between the reservoir regions QR1 and QR2. The first plurality of electrodes 1006 are upper electrode gates. The first plurality of electrodes 1006 include a first electrode 1006a, a second electrode 1006b, a third electrode 1006c, a fourth electrode 1006d, and a fifth electrode 1006e.

The second plurality of electrodes 1020 are lower electrode gates. The second plurality of electrodes 1020 include a sixth electrode 1020a, a seventh electrode 1020b, an eighth electrode 1020c, a ninth electrode 1020d, a tenth electrode 1020e, an eleventh electrode 1020f, a twelfth electrode 1020g, a thirteenth electrode 1020h, a fourteenth electrode 1020i, a fifteenth electrode 1020j, a sixteenth electrode 1020k, and a seventeenth electrode 1020l. Portions of seventh electrode 1020b, eighth electrode 1020c, and ninth electrode 1020d are formed directly over the tunnel barriers 418 associated with quantum dot regions QD1 and QD2, and thus, perform a function similar to the second plurality of electrodes 520 described with reference to FIGS. 5c and 5b.

Directional descriptors such as top, bottom, left, and right are intended solely to facilitate description of seventh quantum semiconductor device 1000. First electrode 1006a is formed at a top of seventh quantum semiconductor device 1000 spaced above and symmetrically on either side of sixth electrode 1020a. Sixth electrode 1020a extends from a top side of seventh quantum semiconductor device 1000 towards a center of seventh quantum semiconductor device 1000.

Seventh electrode 1020b extends from a bottom side of seventh quantum semiconductor device 1000 towards a center of seventh quantum semiconductor device 1000. Fourth electrode 1006d and fifth electrode 1006e are formed at a bottom of seventh quantum semiconductor device 1000 spaced above and on either side of seventh electrode 1020b. Thus, fourth electrode 1006d and fifth electrode 1006e also extend from a bottom side of seventh quantum semiconductor device 1000 towards a center of seventh quantum semiconductor device 1000. Portions of fourth electrode 1006d and fifth electrode 1006e are formed directly over quantum dot regions QD1 and QD2, and thus, perform a function similar to the third plurality of electrodes described with reference to FIGS. 5c and 5b.

Eighth electrode 1020c and ninth electrode 1020d are formed at a top of seventh quantum semiconductor device 1000 spaced below and on either side of first electrode 1006a. Tenth electrode 1020e and eleventh electrode 1020f are formed adjacent eighth electrode 1020c and ninth electrode 1020d, respectively opposite the side on which first electrode 1006a is formed.

Second electrode 1006b is formed on a left side of seventh quantum semiconductor device 1000 and extends toward a center of seventh quantum semiconductor device 1000 generally bounded by tenth electrode 1020e and sixteenth electrode 1020k. Third electrode 1006c is formed on a right side of seventh quantum semiconductor device 1000 and extends toward a center of seventh quantum semiconductor device 1000 generally bounded by eleventh electrode 1020f and seventeenth electrode 1020l.

Twelfth electrode 1020g and thirteenth electrode 1020h extend from left and right sides, respectively, of seventh quantum semiconductor device 1000 towards a center of seventh quantum semiconductor device 1000. Twelfth electrode 1020g and thirteenth electrode 1020h are formed under second electrode 1006b and third electrode 1006c, respectively.

Fourteenth electrode 1020i and fifteenth electrode 1020j are formed on a left and a right side, respectively, of seventh electrode 1020b. Sixteenth electrode 1020k is formed on a left side of fourteenth electrode 1020i. Seventeenth electrode 1020l is formed on a right side of fifteenth electrode 1020j. Fourteenth electrode 1020i, fifteenth electrode 1020j, sixteenth electrode 1020k, and seventeenth electrode 1020l extend from a bottom side of seventh quantum semiconductor device 1000 towards a center of seventh quantum semiconductor device 1000.

Twelfth electrode 1020g and thirteenth electrode 1020h define quantum point contacts for seventh quantum semiconductor device 1000. Twelfth electrode 1020g and thirteenth electrode 1020h act as charge sensors to monitor the charge in each quantum dot and detect changes in charge. Tenth electrode 1020e and eleventh electrode 1020f prevent currents from flowing between the reservoirs QR1 and QR2 and the reservoirs for the quantum point contacts. In particular, when current flows around twelfth electrode 1020g and/or thirteenth electrode 1020h, tenth electrode 1020e and eleventh electrode 1020f prevent current from flowing into the reservoirs QR1 and QR2 formed under first electrode 1006a. Flowing currents generate heat, and it is preferable to maintain the reservoirs QR1 and QR2 as cold as possible.

Figure 11:
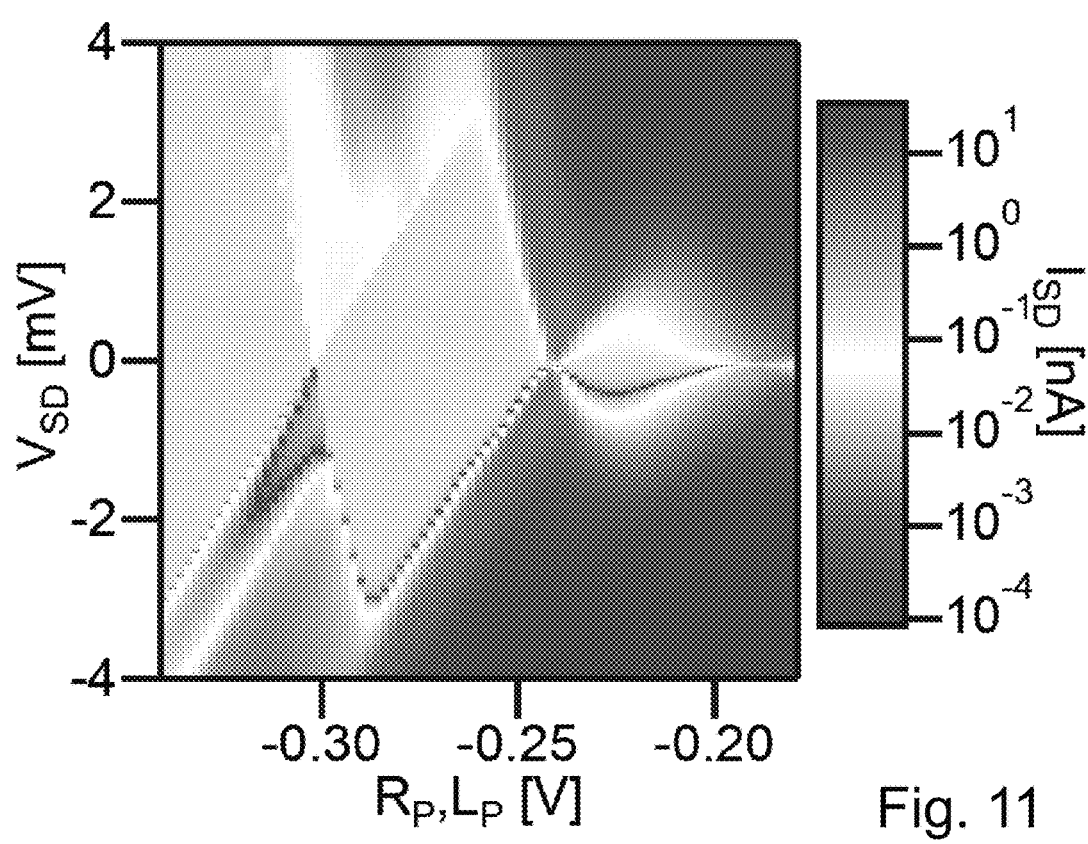

Tests were performed using seventh quantum semiconductor device 1000. With reference to FIG. 11, a graph of a source-drain current ($I_{SD}$) is shown as a function of plunger gate voltages $R_P$, $L_P$ and source-drain bias, $V_{SD}$, which is applied between the reservoirs QR1 and QR2. Plunger gate voltages $R_P$, $L_P$ were applied to fifteenth electrode 1020j and fourteenth electrode 1020i, respectively. Two well defined Coulomb diamonds are visible in FIG. 11. The charging energies are consistent with only a few electrons present in the quantum dot formed under fourth electrode 1006d.

Figure 12:
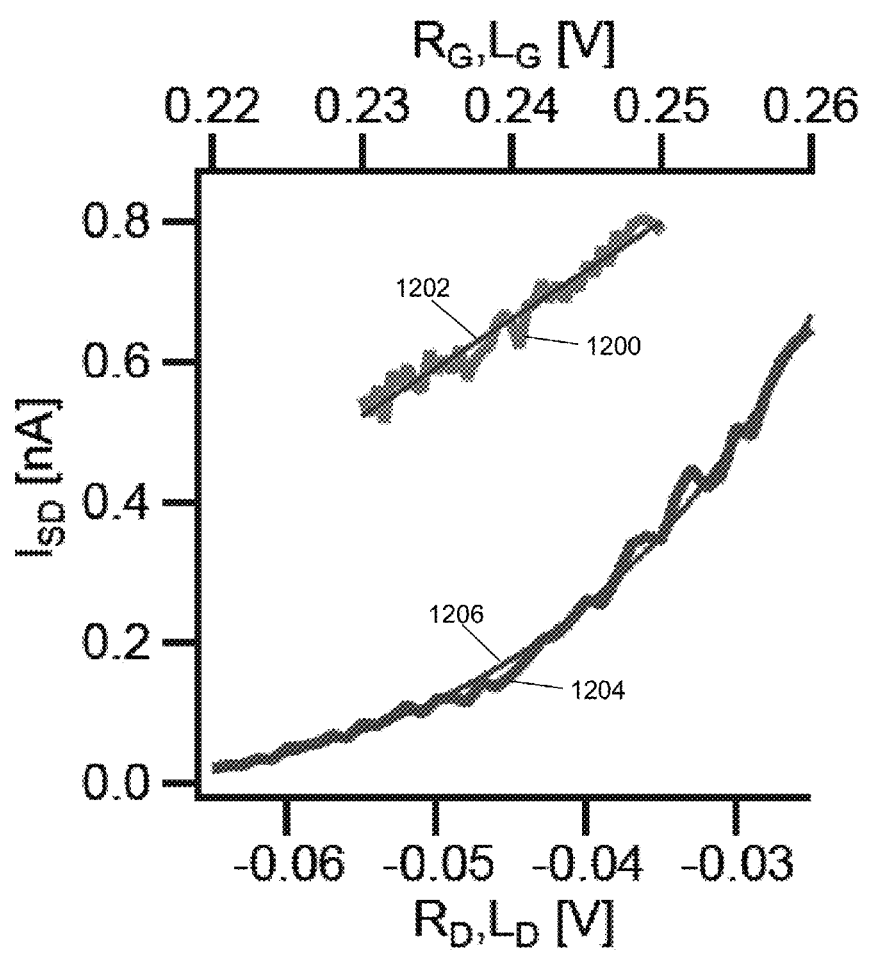

With reference to FIG. 12, a comparison of the source-drain current $I_{SD}$ as a function of voltages applied to accumulation gates $R_D$, $L_D$ and as a function of voltages applied to tunnel barrier gates $R_G$, $L_G$ are shown. Voltages $R_D$, $L_D$ were applied to fifth electrode 1006e and fourth electrode 1006d, respectively. Voltages $R_G$, $L_G$ were applied to ninth electrode 1020d and eighth electrode 1020c, respectively. A first curve 1200 shows the source-drain current $I_{SD}$ as a function of the voltage applied to accumulation gates $R_D$, $L_D$. A second curve 1202 is a curve fit of first curve 1200. Second curve 1202 is approximately linear. A third curve 1204 shows the source-drain current $I_{SD}$ as a function of the voltage applied to accumulation gates $R_G$, $L_G$. A fourth curve 1206 is a curve fit of third curve 1204. Fourth curve 1206 is approximately exponential.

Figure 13:
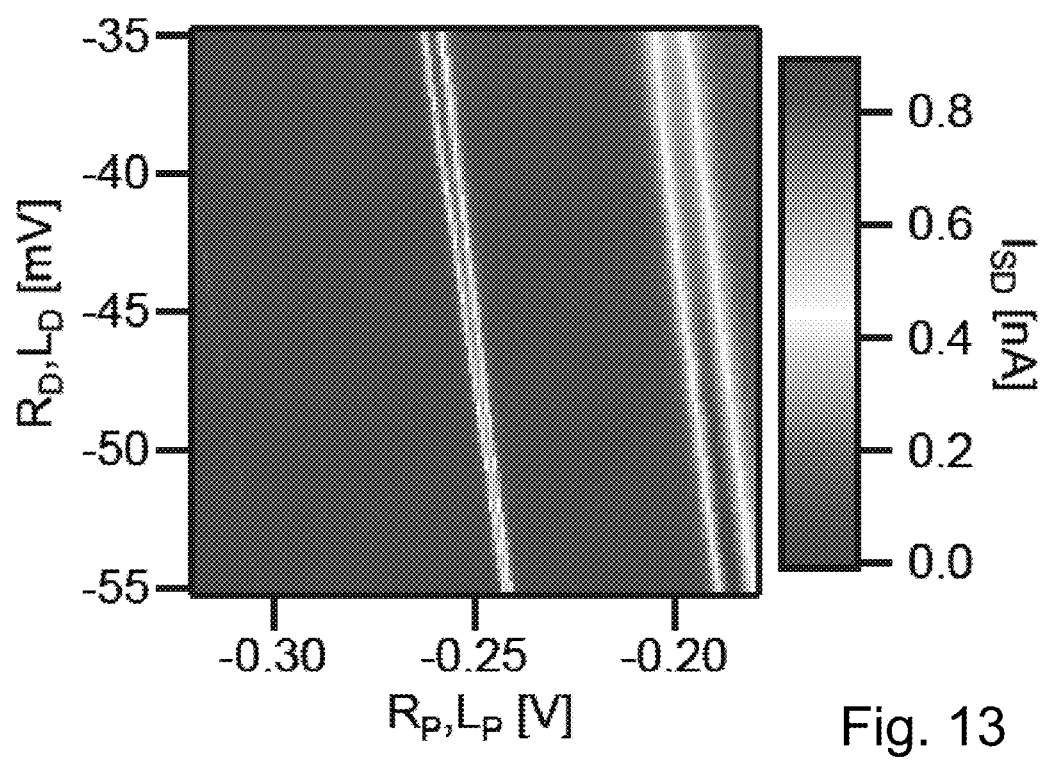
Figure 14:
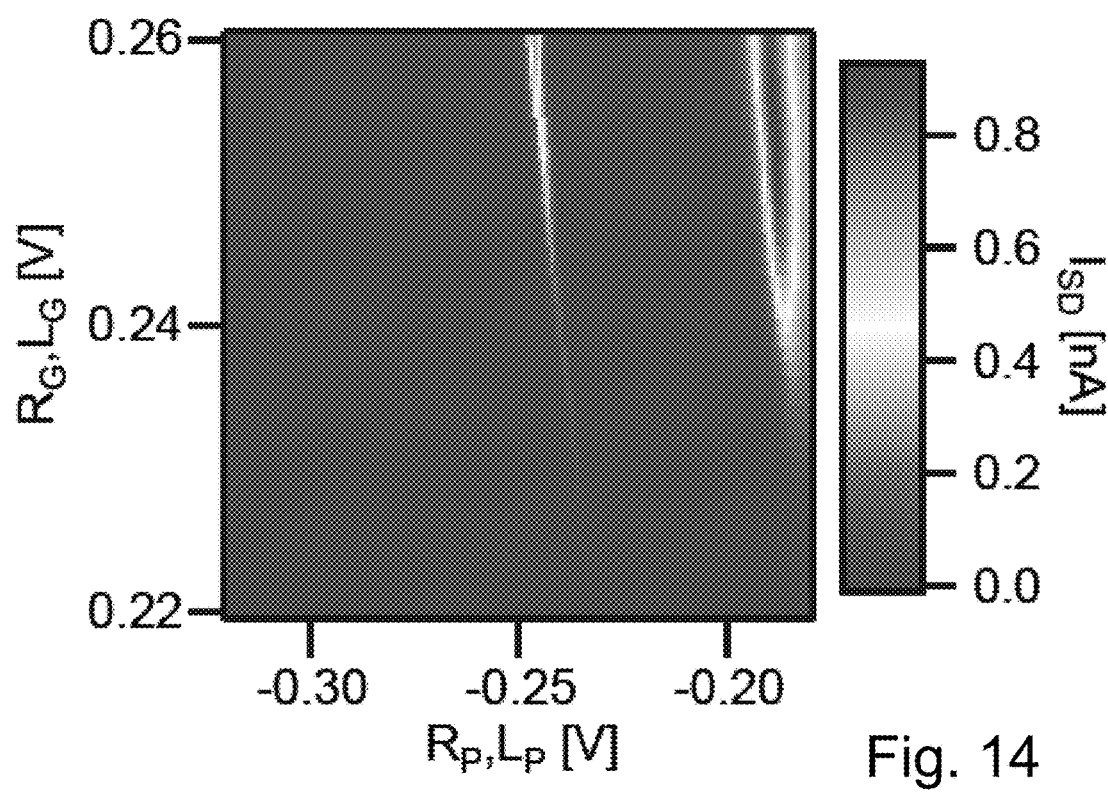

With reference to FIG. 13, the source-drain current $I_{SD}$ as a function of $R_P$, $L_P$ and $R_D$, $L_D$ is shown for $V_{SD}$=50 μV. A linear change in current is measured as well as a linear change in dot energy. With reference to FIG. 14, the source-drain current $I_{SD}$ as a function of $R_P$, $L_P$ and $R_G$, $L_G$ is shown for $V_{SD}$=50 μV. A linear change in current is measured as well as a linear change in dot energy. An exponential increase in current as a function of $R_G$, $L_G$ is measured with a linear shift in dot energy.

Figure 15:
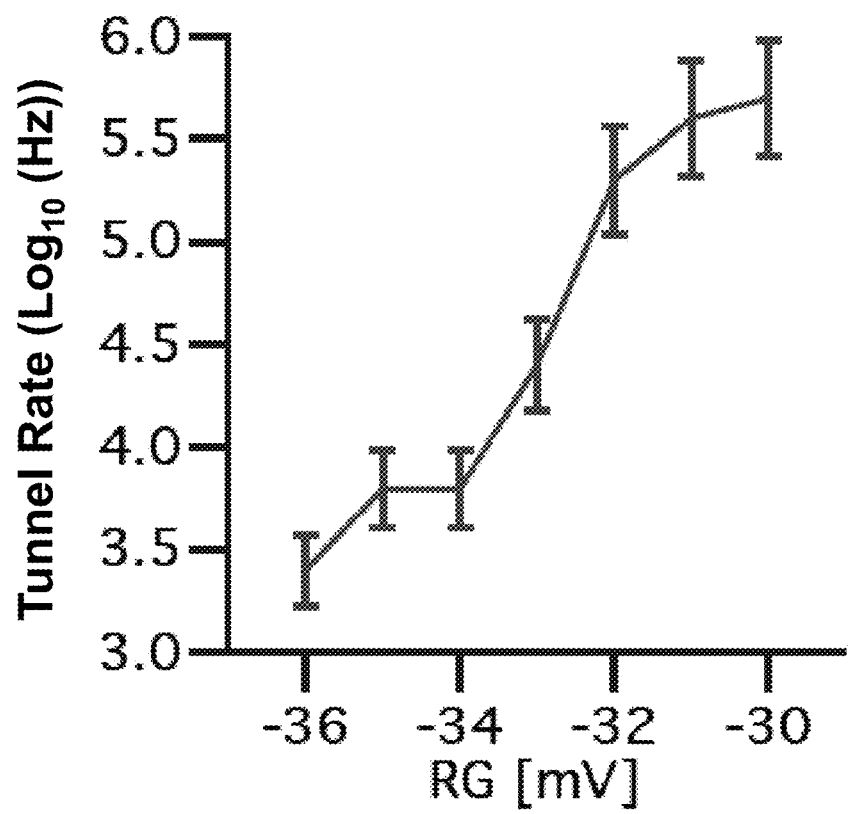
Figure 16:
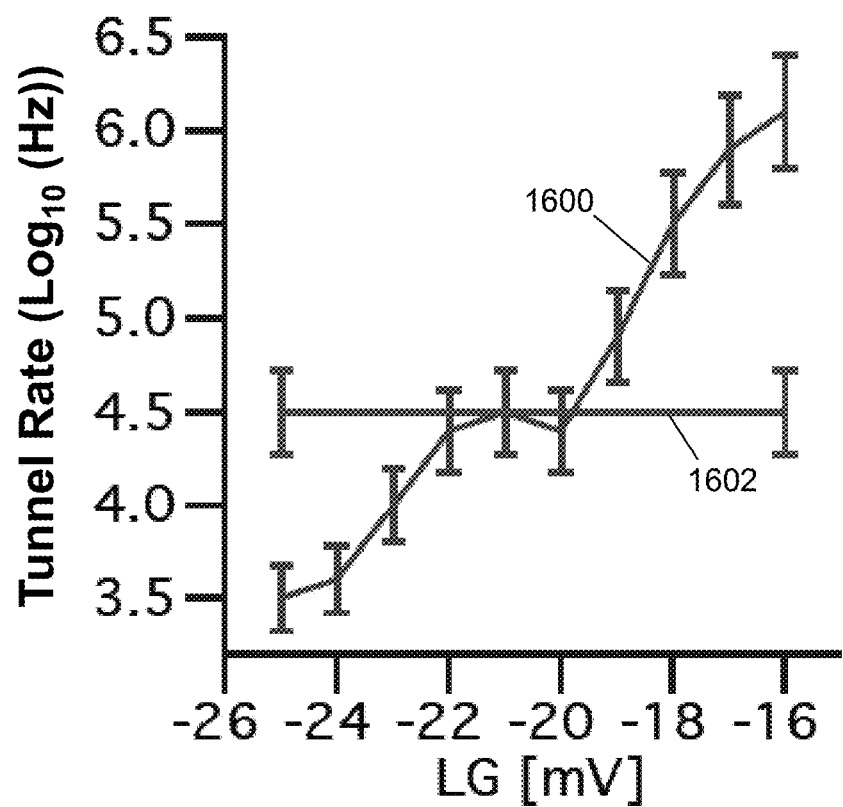

With reference to FIG. 15, right dot (QD2) to reservoir (QR2) loading tunnel frequency ($\Gamma_R$) as a function of $R_G$ is shown. $\Gamma_R$ clearly scales exponentially as a function of $R_G$. With reference to FIG. 16, left dot (QD1) to reservoir (QR1) loading tunnel frequency ($\Gamma_L$) as a function of $L_G$ is shown by first curve 1600. $\Gamma_L$ clearly scales exponentially as a function of $L_G$. Measurements of $\Gamma_R$ were also taken at the begin and end values of $L_G$ and show no discernible change over the range of $L_G$ values demonstrating that eighth electrode 1020c is only a direct barrier control gate for the tunnel barrier directly beneath it.

Figure 17:
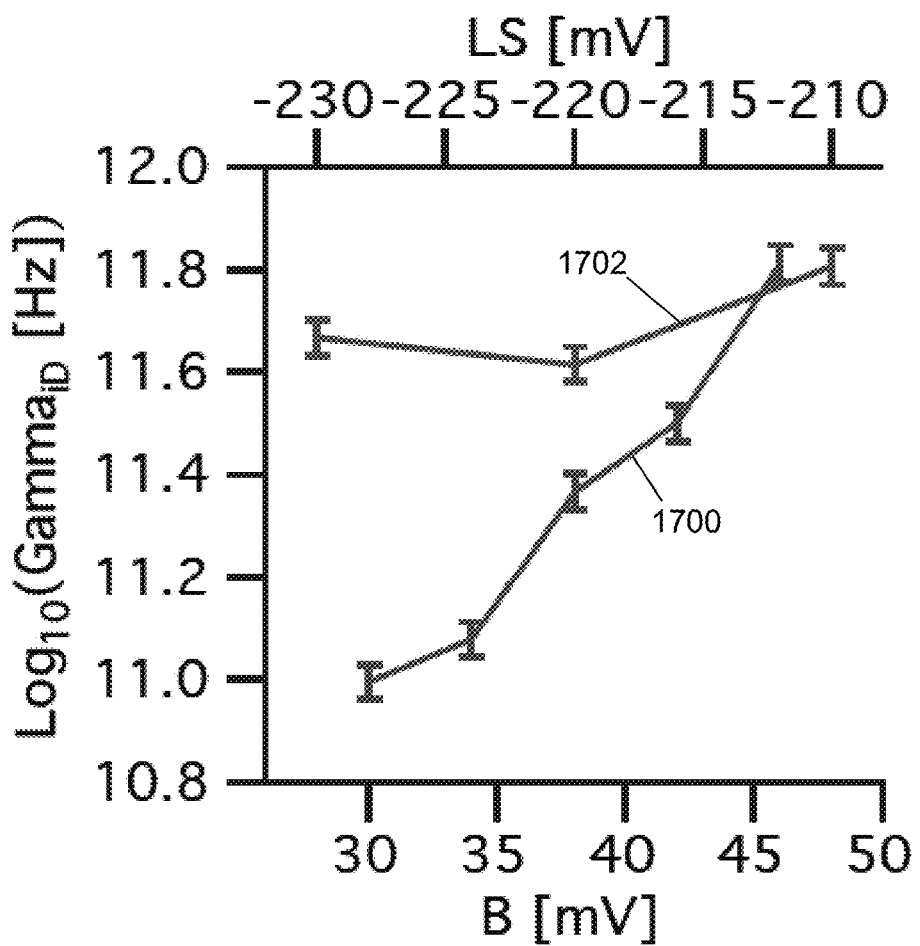

With reference to FIG. 17, left dot (QD1) to right dot (QD2) loading tunnel frequency ($\Gamma_{iD}$) as a function of a voltage B applied to seventh electrode 1020b is shown by a first curve 1700. With reference to FIG. 17, left dot (QD1) to right dot (QD2) loading tunnel frequency ($\Gamma_{iD}$) as a function of a voltage $L_S$ applied to sixteenth electrode 1020k is shown by a second curve 1702. As expected based on the previous results, voltage B applied to seventh electrode 1020b has an exponential effect on $\Gamma_{iD}$. Voltage $L_S$ applied to sixteenth electrode 1020k, the normal depletion gate, has very little effect on $\Gamma_{iD}$.

Figure 1:
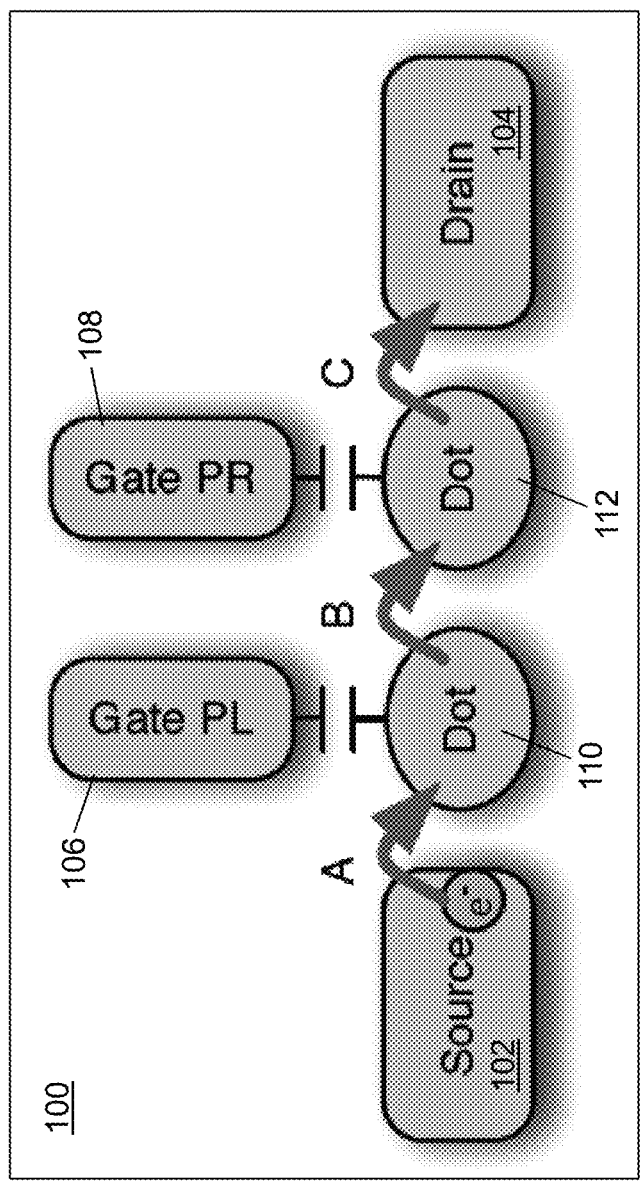
FIG. 1 is a block diagram of a double quantum dot system showing an electron tunneling from a source electrode to a drain electrode through quantum dots in accordance with an illustrative embodiment.
Figure 2:
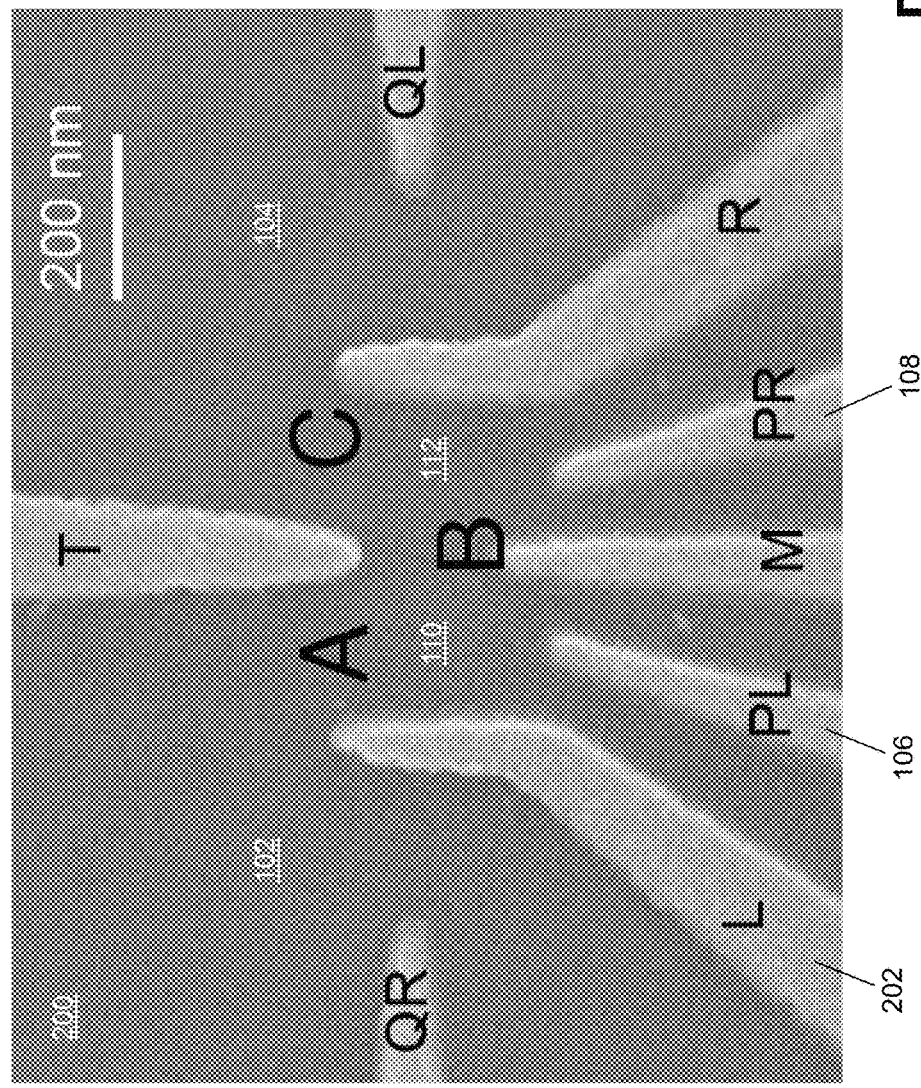
FIG. 2 is a top view of a scanning electron microscope (SEM) image of a legacy "open" style double quantum dot in accordance with an illustrative embodiment.
Figure 3:
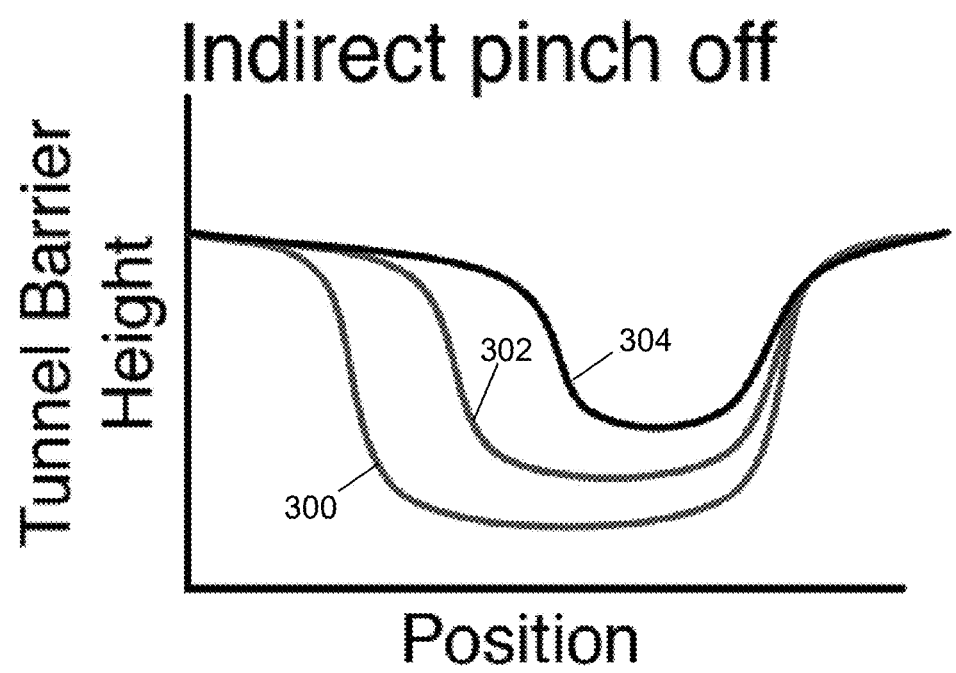
FIG. 3 is a schematic graph showing tunnel barrier height as a function of lateral position for different gate voltages.

Thus, only the direct barrier control gates, seventh electrode 1020b, eighth electrode 1020c, and ninth electrode 1020d, provide the desired exponential control of the tunnel rate, while the electrodes that are not direct barrier gates have linear control of the tunnel rate. Additionally, the control of the left and right tunnel rates is orthogonal with voltage applied to ninth electrode 1020d having little effect on the tunnel rate of eighth electrode 1020c for comparable changes in voltage. Thus, the direct barrier control gates, seventh electrode 1020b, eighth electrode 1020c, and ninth electrode 1020d, only have exponential control of the tunnel barrier directly beneath them. The direct barrier control gates, seventh electrode 1020b, eighth electrode 1020c, and ninth electrode 1020d, act as conventional, indirect gates for other tunnel barriers. The remaining electrodes have linear control of quantum dot tunnel rates. All of the electrodes have linear control of quantum dot energy. Additionally, the direct barrier control gates, seventh electrode 1020b, eighth electrode 1020c, and ninth electrode 1020d, change the tunnel barrier along the length of the gate rather than pinching off the barrier spatially, as illustrated in FIG. 3.

Figure 18:
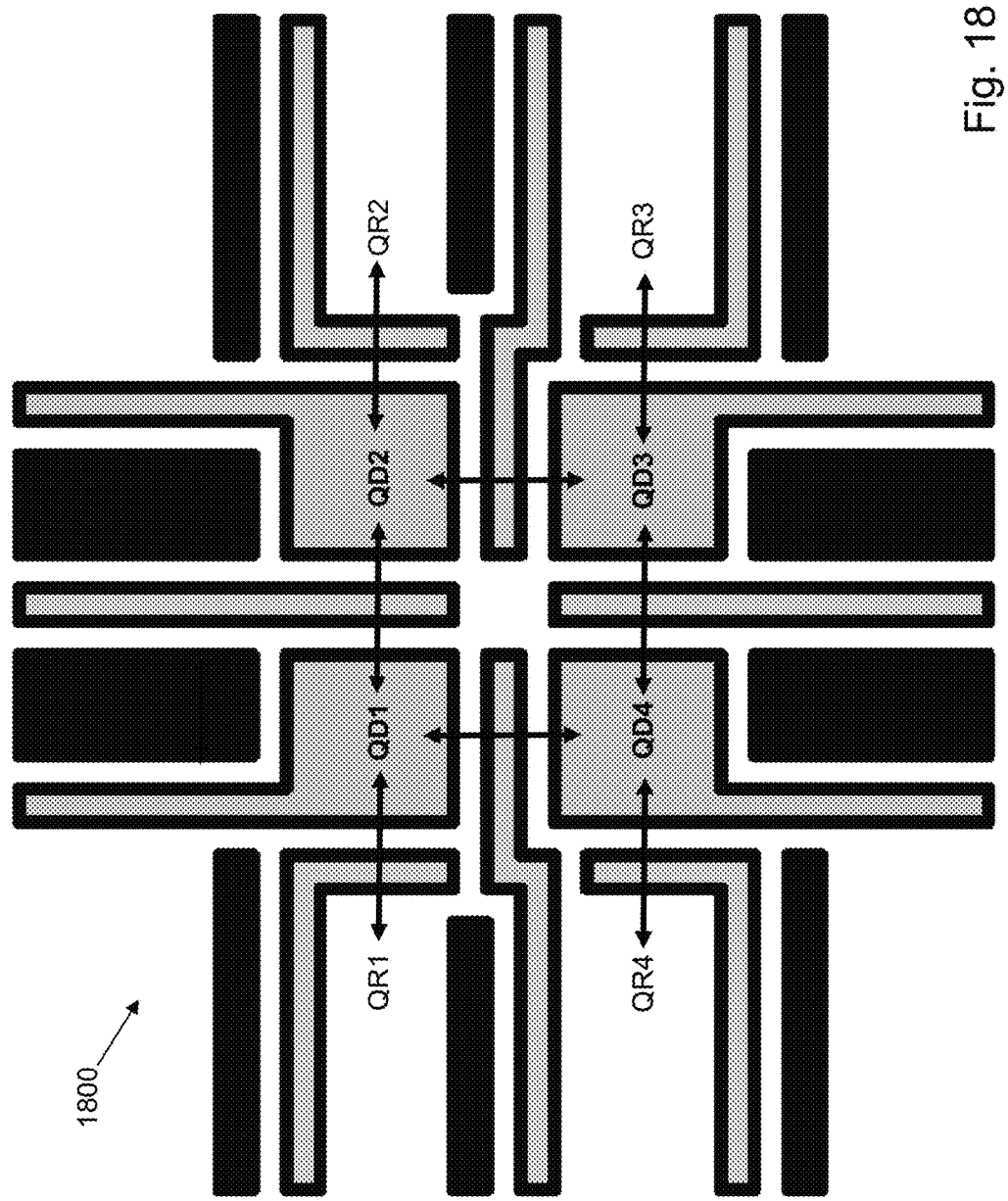
FIG. 18 is a top schematic view of a fourth quantum semiconductor device in accordance with an illustrative embodiment.

The direct barrier control gate architecture of the quantum semiconductor devices 400, 500, 600, 700, 800, 900, 1000 is designed to scale up to larger numbers of connected quantum dots, a key requirement for quantum computing. For example, with reference to FIG. 18, an eighth quantum semiconductor device 1800 is shown. Eighth quantum semiconductor device 1800 is a 2×2 array of four quantum dots formed in a single layer on dielectric layer 404. The quantum dot regions formed by eighth quantum semiconductor device 1800 are referenced as QD1, QD2, QD3, QD4 in FIG. 18. Directional arrows indicate the location of tunnel barriers through which the electrons can move between the quantum dot regions QD1, QD2, QD3, QD4. The quantum dot reservoir regions are referenced as QR1, QR2, QR3, QR4 in FIG. 18. Directional arrows also indicate the location of tunnel barriers through which the electrons can move between the respective quantum dot reservoir region and quantum dot region.

Figure 19:
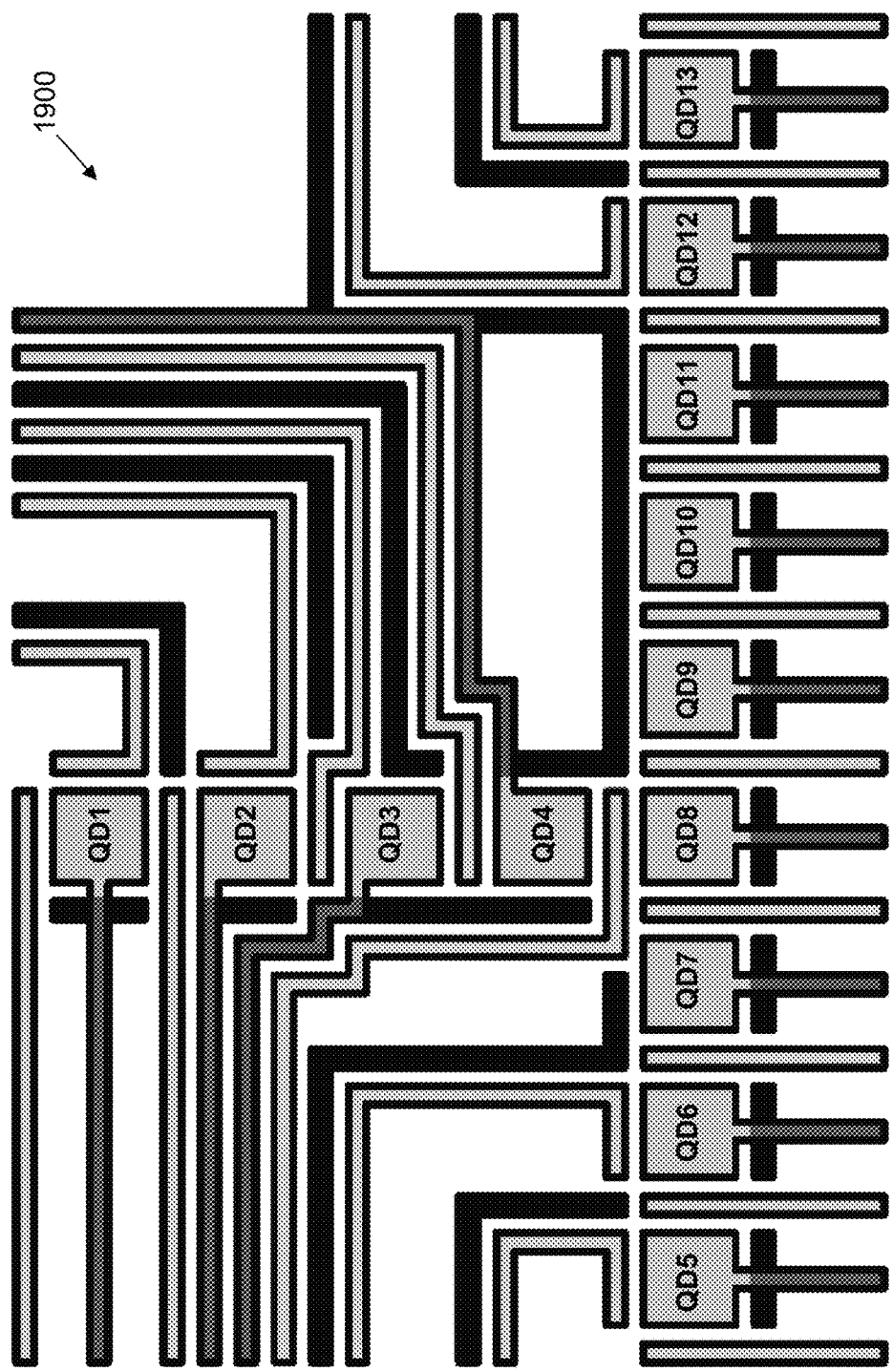
FIG. 19 is a top schematic view of a fifth quantum semiconductor device in accordance with an illustrative embodiment.
Figure 20:
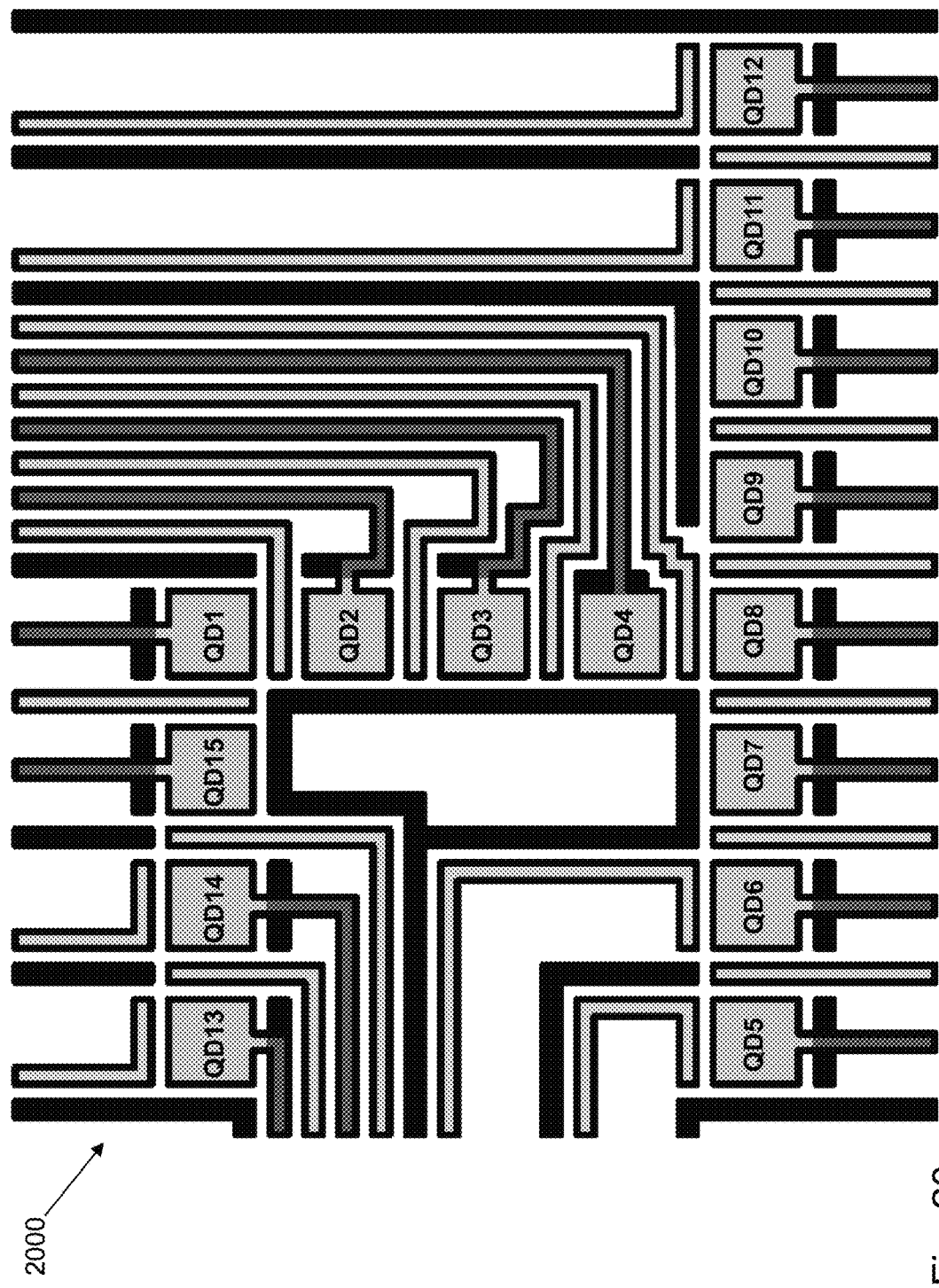
FIG. 20 is a top schematic view of a sixth quantum semiconductor device in accordance with an illustrative embodiment.

With reference to FIG. 19, a ninth quantum semiconductor device 1900 is shown. Ninth quantum semiconductor device 1900 forms a T-junction where one line of quantum dots is split into two. With reference to FIG. 20, a tenth quantum semiconductor device 2000 is shown. Tenth quantum semiconductor device 2000 forms a second type of T-junction, where one line of quantum dots is split into two, and where the lines exit the structure parallel to each other.

The optimal dimensions of the plurality of electrodes 406 of each quantum semiconductor device is dependent on the semiconducting material used (i.e., Si or GaAs), the heterostructure dimensions, and the thicknesses of dielectric layer 404, 504 as understood by a person of skill in the art.

Though the direct barrier control gate architectures have been described in the context of controlling the tunnel rate into and out of quantum dots, the direct barrier control gate architectures could also be used to create more traditional electronics where control of current via a voltage is desired. It is important to note that the preceding discussion referred to two-dimensional electron gases and quantum dots containing electrons. With the appropriate semiconductor materials, the charge carriers could be holes as understood by a person of skill in the art.

Though the arrangement of the tunnel barriers have been generally orthogonal or in lines in the described embodiments, the tunnel barriers need not be arranged either parallel or perpendicular. For example, the tunnel barriers can be arranged at angles less than 90 degrees to form triangular type arrangements.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A quantum semiconductor device comprising:
a quantum heterostructure comprising a quantum well layer, the quantum heterostructure configured to form a two-dimensional electron gas (2DEG) within the quantum well layer upon application of an electric field;
a dielectric layer composed of a dielectric material formed directly on the quantum heterostructure; and
a plurality of electrodes separated from each other and in direct contact with the dielectric layer, the plurality of electrodes comprising a first subset of electrodes and a second subset of electrodes,
wherein the first subset of electrodes is configured to delineate lateral boundaries of regions within the quantum well layer, the regions within the quantum well layer comprising a first quantum dot region having lateral dimensions sufficient to confine an electron of the 2DEG laterally in two dimensions to support formation of a first quantum dot within the quantum well layer; a second quantum dot region adjacent to the first quantum dot region and having lateral dimensions sufficient to confine another electron laterally in two dimensions to support formation of a second quantum dot within the quantum well layer; and a first quantum reservoir region adjacent to the first quantum dot region and having lateral dimensions larger than the lateral dimensions of each of the first and second quantum dot regions and sufficient to act as a source of a plurality of electrons of the 2DEG,
wherein the second subset of electrodes is configured to control electron accumulation and depletion within the regions within the quantum well layer,
wherein a first electrode belonging to the second subset of electrodes is positioned directly above the first quantum dot region,
a second electrode belonging to the second subset of electrodes is positioned directly above the second quantum dot region,
a third electrode belonging to the first subset of electrodes is positioned between the first and second electrodes and directly above a first tunnel barrier through which the electron tunnels from the first quantum dot region directly to the second quantum dot region along a first electron pathway within the quantum well layer,
and a fourth electrode belonging to the first subset of electrodes is positioned adjacent to the first electrode and directly above a second tunnel barrier through which the electron tunnels from the first quantum dot region directly to the first quantum reservoir region along a second electron pathway within the quantum well layer,
and further wherein the first, second, third and fourth electrodes are positioned such that the first electron pathway is coplanar but not collinear with the second electron pathway.

2. The quantum semiconductor device of claim 1, wherein the dielectric material is an oxide material.

3. The quantum semiconductor device of claim 2, wherein the oxide material is selected from the group consisting of $Al_2O_3$ and $HfO_2$.

4. The quantum semiconductor device of claim 1, wherein the quantum well layer is formed of Si.

5. The quantum semiconductor device of claim 4, the quantum heterostructure further comprising a first tunnel barrier layer formed on the quantum well layer and a cap layer formed on the first tunnel barrier layer, wherein the dielectric layer is formed on the cap layer.

6. The quantum semiconductor device of claim 5, wherein the cap layer is formed of Si.

7. The quantum semiconductor device of claim 6, the quantum heterostructure further comprising a second tunnel barrier layer, wherein the first tunnel barrier layer and the second tunnel barrier layer are formed of SiGe.

8. The quantum semiconductor device of claim 4, the quantum heterostructure further comprising a first tunnel barrier layer formed on the quantum well layer, wherein the first tunnel barrier layer is formed of $SiO_2$ and the dielectric layer is formed on the first tunnel barrier layer.

9. The quantum semiconductor device of claim 1, wherein the quantum well layer is formed of GaAs.

10. The quantum semiconductor device of claim 9, the quantum heterostructure further comprising a first tunnel barrier layer formed on the quantum well layer and a cap layer formed on the first tunnel barrier layer, wherein the dielectric layer is formed on the cap layer.

11. The quantum semiconductor device of claim 10, wherein the cap layer is formed of GaAs.

12. The quantum semiconductor device of claim 11, wherein the first tunnel barrier layer is formed of $Al_xGa_{1-x}As$.

13. The quantum semiconductor device of claim 1, the quantum heterostructure further comprising a first tunnel barrier layer, wherein the quantum well layer is formed on the first tunnel barrier layer, and the dielectric layer is formed on the quantum well layer.

14. The quantum semiconductor device of claim 13, wherein the quantum well layer is formed of graphene.

15. The quantum semiconductor device of claim 13, wherein the first tunnel barrier layer is formed of $SiO_2$.

16. The quantum semiconductor device of claim 1, wherein the first and second electrodes are on the surface of the dielectric layer, thereby forming an upper electrode layer, and the third and fourth electrodes are within the dielectric layer, thereby forming a lower electrode layer.

17. The quantum semiconductor device of claim 1, wherein a fifth electrode belonging to the second subset of electrodes is positioned directly above the first quantum reservoir region.

18. The quantum semiconductor device of claim 1, wherein the first subset of electrodes is further configured to delineate lateral boundaries of a second quantum reservoir region adjacent to the second quantum dot region and having lateral dimensions larger than the lateral dimensions of each of the first and second quantum dot regions and sufficient to act as another source of a plurality of electrons of the 2DEG, wherein a fifth electrode belonging to the first subset of electrodes is positioned adjacent to the second electrode and directly above a third tunnel barrier through which the another electron tunnels from the second quantum dot region directly to the second quantum reservoir region along a third electron pathway within the quantum well layer, and further wherein the fifth electrode is positioned such that the third electron pathway is coplanar but not collinear with the first electron pathway.

19. The quantum semiconductor device of claim 18, wherein the first subset of electrodes is further configured to delineate lateral boundaries of an additional region adjacent to the first quantum dot region into which the electron tunnels directly from the first quantum dot region via a fourth tunnel barrier, wherein the additional region is a third quantum reservoir region or a third quantum dot region, and further wherein a sixth electrode belonging to the second subset of electrodes is positioned to a side of the first electrode and directly above the additional region.

20. The quantum semiconductor device of claim 19, wherein the first subset of electrodes is further configured to delineate lateral boundaries of a fourth quantum reservoir region adjacent to the second quantum dot region into which the another electron tunnels directly from the second quantum dot region via a fifth tunnel barrier, and further wherein a seventh electrode belonging to the second subset of electrodes is positioned to a side of the second electrode and directly above the fourth quantum reservoir region.

21. The quantum semiconductor device of claim 19, wherein a seventh electrode belonging to the first subset of electrodes is positioned between the sixth electrode and the first electrode and directly above the fourth tunnel barrier.

* * * * *